(12) United States Patent
Lee et al.

(10) Patent No.: US 8,035,151 B2
(45) Date of Patent: Oct. 11, 2011

(54) SEMICONDUCTOR DEVICE CAPABLE OF SUPPRESSING SHORT CHANNEL EFFECT AND METHOD OF FABRICATING THE SAME

(75) Inventors: Chang-Hyun Lee, Suwon-si (KR); Jung-Dal Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 249 days.

(21) Appl. No.: 12/382,385

(22) Filed: Mar. 16, 2009

(65) Prior Publication Data

US 2009/0230451 A1    Sep. 17, 2009

(30) Foreign Application Priority Data

Mar. 17, 2008    (KR) .................. 10-2008-0024520

(51) Int. Cl.
*H01L 29/788*    (2006.01)

(52) U.S. Cl. ..... 257/315; 257/368; 257/324; 257/E29.3; 257/E29.309

(58) Field of Classification Search .................. 257/315, 257/368, 324, E29.3, E29.309
See application file for complete search history.

(56) References Cited

U.S. PATENT DOCUMENTS

| | | | |
|---|---|---|---|
| 5,473,563 | A | 12/1995 | Suh et al. |
| 6,858,899 | B2 | 2/2005 | Mahajani et al. |
| 7,042,770 | B2 | 5/2006 | Lee et al. |
| 7,253,467 | B2 | 8/2007 | Lee et al. |
| 2005/0104120 | A1* | 5/2005 | Ichige et al. .................. 257/315 |
| 2006/0028876 | A1 | 2/2006 | Quader et al. |
| 2006/0180851 | A1 | 8/2006 | Lee et al. |
| 2007/0205445 | A1 | 9/2007 | Park et al. |

FOREIGN PATENT DOCUMENTS

| | | |
|---|---|---|
| EP | 0 923 139 A2 | 6/1999 |
| EP | 0 923 139 A3 | 6/1999 |
| JP | 2000-068487 A | 3/2000 |
| KR | 10-1999-0062796 A | 7/1999 |
| KR | 10-2000-0027286 A | 5/2000 |
| KR | 10-2007-0002302 A | 1/2007 |
| KR | 10-0673020 B1 | 1/2007 |

* cited by examiner

*Primary Examiner* — Zandra Smith
*Assistant Examiner* — Paul Patton
(74) *Attorney, Agent, or Firm* — Lee & Morse, P.C.

(57) ABSTRACT

A semiconductor device includes a semiconductor substrate including at least one memory channel region and at least one memory source/drain region, the memory channel region and the memory source/drain region being arranged alternately, and at least one word line on the memory channel region, wherein the memory source/drain region has a higher net impurity concentration than the memory channel region.

20 Claims, 27 Drawing Sheets

SEMICONDUCTOR DEVICE CAPABLE OF SUPPRESSING SHORT CHANNEL EFFECT AND METHOD OF FABRICATING THE SAME

BACKGROUND

1. Field

Embodiments disclosed herein relate to a semiconductor device and a method of fabricating the same. More particularly, embodiments relate to a semiconductor device capable of suppressing short channel effect and a method of fabricating the same.

2. Description of the Related Art

A conventional transistor, e.g., a metal oxide semiconductor field effect transistor (MOSFET), may include a gate electrode formed on a semiconductor substrate and source/drain regions formed on the semiconductor substrate at both sides of the gate electrode. The source/drain regions may be doped with conductive impurities different from a conductive impurity of the semiconductor substrate, and may be used as source/drain electrodes of the transistor. A channel region may be defined under the gate electrode between the source and drain electrodes.

A plurality of the transistors, e.g., memory cell transistors and selection transistors, may be arranged to form a unit memory string in a memory device, e.g., a NAND flash memory device. For example, the memory cell transistors in a memory device may be programmed to store data, while a selection transistor may facilitate selection of memory cell transistors to be programmed. In order to prevent a memory cell in an unselected memory string from being unintentionally programmed, selection transistors of the unselected memory string may maintain an off-state during a program operation, so channel regions in the unselected memory string may be set in an electrically floating state, i.e., self-boosting. Since the unselected memory string is set in a floating state, even when an increased electric potential is applied to the word line, i.e., program voltage and a pass voltage, an unintentional program operation of the unselected memory cell may be prevented.

However, when an integration degree of the memory device is increased, a channel length of the selection transistor in the memory device may be reduced, thereby causing a short channel effect, e.g., one or more of punch-through and leakage current, in the selection transistor. Since short channel effects may deteriorate efficiency of the self-boosting, e.g., increased leakage current in selection transistors may erroneously register an "off-state" of the selection transistor as an "on-state," program defects may be increased, e.g., erroneous memory cell programming, due to program disturbance.

SUMMARY

Example embodiments are therefore directed to a semiconductor device and a method of fabricating the same, which substantially overcome one or more of the shortcomings and disadvantages of the related art.

It is therefore a feature of an embodiment to provide a semiconductor device with a structure having an improved leakage current blocking characteristic.

It is another feature of an embodiment to provide a method of fabricating a semiconductor device with a structure having an improved leakage current blocking characteristic.

It is yet another feature of an embodiment to provide a NAND flash memory device with selection transistors having improved leakage current blocking characteristic.

It is still another feature of an embodiment to provide a NAND flash memory device capable of preventing efficiency deterioration of self-boosting and having an increased degree of integration.

It is yet another feature of an embodiment to provide a NAND flash memory device capable of simultaneously improving leakage current blocking characteristics of selection transistors in a memory cell array and of transistors in a peripheral circuit.

It is still another feature of an embodiment to provide a method of fabricating a NAND flash memory device including one or more of the above features.

At least one of the above and other features may be realized by providing a semiconductor device, including a semiconductor substrate having a memory channel region and a memory source/drain region, the memory channel region and the memory source/drain region being arranged alternately, and word lines disposed on the memory channel region, wherein the memory source/drain region has a higher net impurity concentration than the memory channel region.

In some embodiments, the memory source/drain region and the memory channel region may have the same conductivity type.

In other embodiments, the memory source/drain region may have a higher threshold voltage than the memory channel region.

In still other embodiments, the memory source/drain region may be inversed by a fringe field from a word line adjacent to the memory source/drain region to be used as a source/drain electrode of a memory cell transistor.

In even other embodiments, the net impurity concentration of the memory channel region may be higher below a sidewall of the word line than below a middle part of the word line.

In yet other embodiments, the word lines may constitute a word line structure, and a selection line structure including at least one selection line may be further disposed around the word line structure.

In further embodiments, an outer contact region may be further disposed at one side of the selection line, the outer contact region having a different conductivity type than the memory channel region and being connected to a bit line or a common source line, wherein a region between the outer contact region and the selection line may be inversed by a fringe field from the selection line.

In still further embodiments, an impurity region having the same conductivity type as the memory channel region may be formed between the outer contact region and the selection line.

In even further embodiments, an impurity region having a different conductivity type than the memory channel region may be further formed in a semiconductor substrate between the selection line and the word line that is the most adjacent thereto.

In yet further embodiments, at least one word line adjacent to the selection line may be used as a dummy line constituting a dummy cell that is not used for storing data.

In yet further embodiments, the selection line structure may include a first selection line and a second selection line, respectively disposed at both sides of the word line structure, and the word line structure may include the n number of first dummy lines disposed adjacent to the first selection line and the n+1 number of second dummy lines disposed adjacent to the second selection line.

In yet further embodiments, at least one impurity region having a different conductivity type than the memory channel region may be further formed in a semiconductor substrate below at least one of regions between the first dummy lines or at least one of regions between the second dummy lines.

In yet further embodiments, the selection line structure may include at least two selection lines disposed in series, and a selection source/drain region having the same conductivity type as the memory channel region but a higher net impurity concentration than the memory channel region may be formed in a semiconductor substrate between at least two selection lines disposed in series.

In yet further embodiments, the semiconductor device may further include an information storage between the word line and the memory channel region, wherein the information storage may be a charge trap structure including a sequentially-stacked tunnel insulation layer, charge storage layer, and a blocking insulation layer or a floating gate structure including a sequentially-stacked gate insulation layer, floating gate electrode, and a gate interlayer insulation layer.

At least one of the above and other features may be also realized by providing a semiconductor memory device, including a plurality of word lines crossing over an active region of a semiconductor substrate, wherein an active region between the word lines may have a higher threshold voltage than an active region below the word line.

In yet further embodiments, the word lines may constitute a word line structure, a selection line structure including at least one selection line may be further disposed around the word line structure, at least one word line adjacent to the selection line may be used as a dummy line constituting a dummy cell, and an impurity region having a different conductivity type than a semiconductor substrate below the word line may be further disposed in a semiconductor substrate between the selection line and the dummy line.

In yet further embodiments, an active region on at least one side of at least one selection line may have a higher threshold voltage than an active region below the word line.

In yet further embodiments, the selection line structure may include a first selection line and a second selection line, respectively disposed on both sides of the word line structure, and the word line structure may include the n number of first dummy lines disposed adjacent to the first selection line and the n+1 number of second dummy lines disposed adjacent to the second selection line.

At least one of the above and other features may be further realized by providing a semiconductor device, including an active region between adjacent at least two selection lines having the same conductivity type as an active region below the selection line but having a higher net impurity concentration than an active region below the selection line.

At least one of the above and other features may be also realized by providing a semiconductor device, including a pair of selection transistors, and memory cell transistors connected in series between the selection transistors, wherein at least one of the selection transistors and the memory cell transistors have the same gate structure including a sequentially-stacked tunnel insulation layer, charge storage layer, and a blocking insulation layer, at least one of the memory cell transistors includes a memory channel region and a memory source/drain region, the memory channel region being formed in a semiconductor substrate below the gate structure, the memory source/drain region having the same conductivity type as the memory channel region and being formed in a semiconductor substrate at both sides of the gate structure, and an impurity region having a different conductivity type than the memory channel region is formed between a gate structure of the selection transistor and a gate structure of the memory cell transistor that is the most adjacent thereto.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
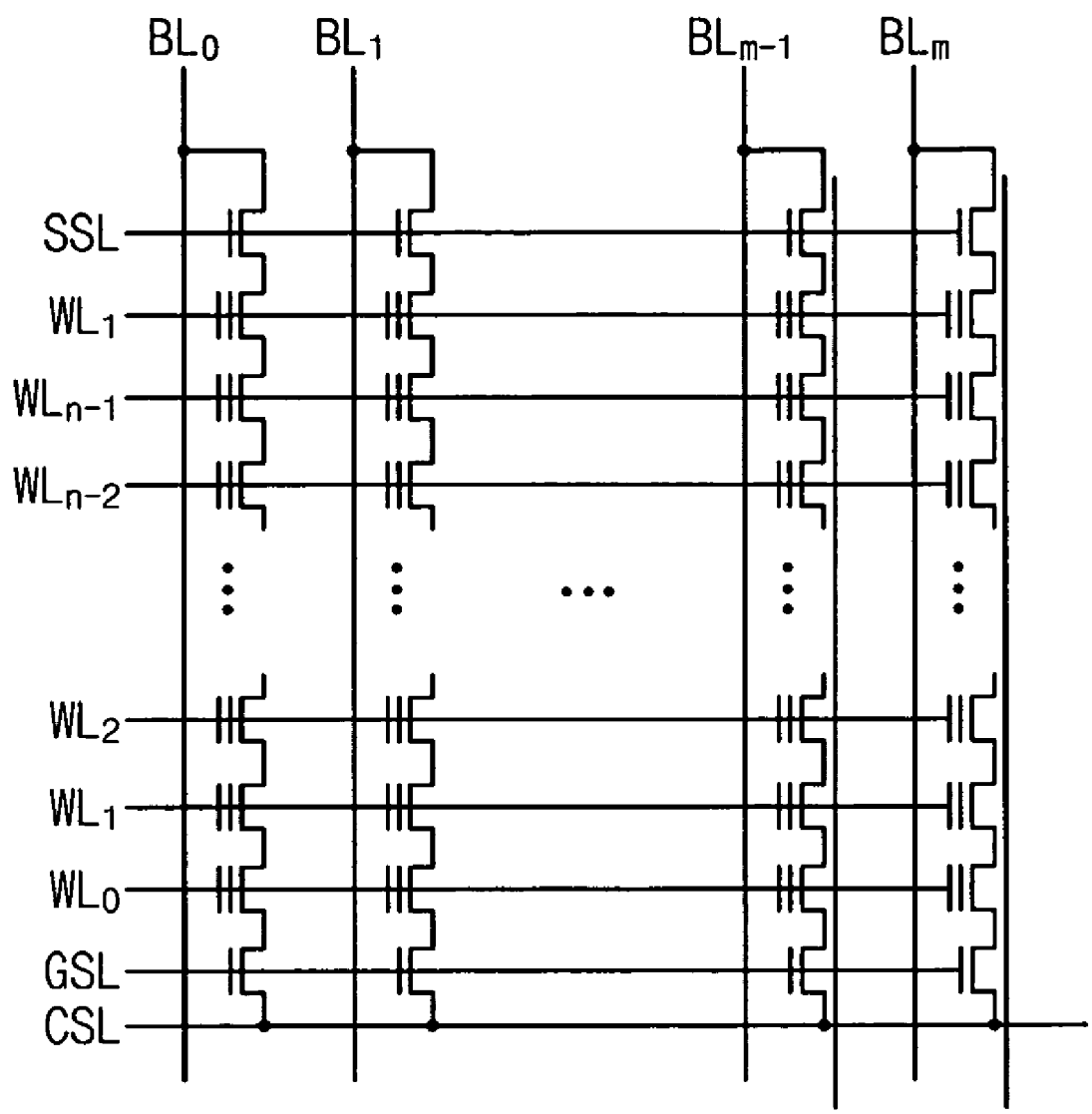
FIG. 1 illustrates a circuit diagram of a cell array of a NAND flash memory device according to an example embodiment.

Korean Patent Application No. 10-2008-0024520, filed on Mar. 17, 2008, in the Korean Intellectual Property Office, and entitled: "Semiconductor Device Capable of Suppressing Short Channel Effect and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the specification, it will be understood that when a layer (or film) is referred to as being 'on' another layer or substrate, it can be directly on the other layer or substrate, or intervening layers may also be present. In addition, when a layer (or film) is referred to as being 'between' two layers or elements, it can be directly between the two layers or elements, or intervening layers may also be present. Also, in the figures, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof.

As used herein, the terms "a" and "an" are open terms that may be used in conjunction with singular items or with plural items.

Embodiments where a channel region of a semiconductor substrate or a transistor is a p-type will be described below, and description of embodiments including an n-type channel region will be omitted for conciseness. However, it is apparent to those skilled in the art that embodiments including n-type channel regions may be easily applied to embodiments including p-type channel regions, e.g., p-type metal oxide field effect transistor (PMOSFET). Due to this fact, it should not be understood that the present invention is limited to the embodiments of the p-conductivity type.

In example embodiments, a semiconductor device may include a plurality of memory cells connected in series, and a plurality of selection transistors connecting the outermost memory cells among the memory cells with outer contact regions in series. An inversion layer may be formed between each selection transistor and a corresponding outer contact region to electrically connect the outer contact region and the selection transistor. The inversion layer may be induced by a fringe field caused by a gate voltage applied to the selection transistor. A portion of a semiconductor substrate having the inversion layer between the outer contact region and a selection line of the selection transistor may include an impurity region having the same conductivity type as a memory channel region.

For example, the semiconductor substrate may have an active region, a gate structure including a pair of selection lines and word lines, the selection lines crossing over the active region and the word lines crossing over the active region between the selection lines, a pair of a source region and a drain region disposed respectively at both sides of the gate structure, the pair having a different conductivity type than the semiconductor substrate and being spaced apart from the gate structure, and at least one impurity region having a different conductivity type than the semiconductor substrate and disposed between the pair of source and drain regions. At least one of active regions between the gate structure and the source region and an active region between the drain regions may have the same conductivity type as the semiconductor substrate. The active region may include memory source/drain regions disposed between the word lines, the memory source/drain region having a different conductivity type than the semiconductor substrate.

In other embodiments, the active region may include a memory source/drain region disposed between the word lines, and the memory source/drain region may have the same conductivity type as the semiconductor substrate in order to constitute a field effect source/drain electrode. The region may include at least one selection source/drain region disposed around at least one of the selection lines, and the selection source/drain region may have a different conductivity type than the semiconductor substrate. The active region may include memory source/drain regions disposed between the word lines and at least one selection source/drain region disposed around at least one of the selection lines, and the memory source/drain region may have the same conductivity type and the same doping profile as the selection source/drain region.

In other embodiments, a semiconductor device my further include an auxiliary selection line between the selection line and the word line in order to connect the selection line and the word line in series. An impurity region having a different conductivity type from the semiconductor substrate may be formed in an active region between the auxiliary selection line and the selection line. The impurity region having a different conductivity type than the semiconductor substrate may be formed in an active region between the auxiliary selection line and the word line. The impurity region having a different conductivity type than the semiconductor substrate may be formed in the active region between the auxiliary selection line and the word line and in the active region between the auxiliary selection line and the selection line.

The semiconductor substrate may further include a peripheral region including at least one peripheral transistor, the peripheral transistor having a gate electrode and a peripheral source/drain region spaced apart from the gate electrode. A semiconductor substrate between the peripheral source/drain region and the gate electrode may be a field effect source/drain structure inversed by a voltage applied to the gate electrode. The peripheral transistor may include at least one high voltage transistor and at least one low voltage transistor, the peripheral source/drain region may include a peripheral high concentration impurity region and a peripheral low concentration impurity region surrounding the peripheral high concentration impurity region, and an interval between the peripheral high concentration impurity region and a corresponding gate electrode of the high voltage transistor may be greater than an interval between the peripheral high concentration impurity region and a corresponding gate electrode of the low voltage transistor.

A method of fabricating a semiconductor device according to an example embodiment may include forming a source/drain region by implanting impurities of a first conductivity type between at least two gate patterns, after forming the gate patterns on a semiconductor substrate of the first conductivity type, the gate patterns including an information storage. Forming of the source/drain region may include ion-implanting the impurities of the first conductivity type at an angle slanted with respect to a top of the semiconductor substrate. The source/drain region may be formed deeper at an edge of an active region than at a middle part of the active region.

According to another example embodiment, a method of fabricating a semiconductor device may include forming a gate structure including gate lines, the gate lines crossing over an active region, forming spacer patterns on sidewalls of the gate lines, and forming a source/drain region in the active region, the source/drain region having a different conductivity type than the active region, wherein the source/drain region is formed using an ion implantation process that uses the gate lines and the spacer pattern as an ion mask and thus is spaced apart from the gate line.

Forming of the gate structure may include forming selection lines of a selection transistor constituting a memory string and a gate line of a peripheral transistor constituting a peripheral circuit, wherein the forming of the source/drain region may include simultaneously forming the source/drain region in an active region around the selection line of the selection transistor and an active region around the gate line of the peripheral transistor. The source/drain region formed in the active region around the gate line of the peripheral transistor maybe formed after forming the spacer pattern, such that an active region between the gate line of the peripheral transistor and the source/drain adjacent thereto may have the same conductivity type as an active region below the gate line of the peripheral transistor.

A more detailed description of an example embodiment will be described with reference to FIGS. 1-3 below.

FIG. 1 illustrates a circuit diagram of a cell array of a NAND flash memory device according to an example embodiment.

Referring to FIG. 1, a ground selection line GSL, a string selection line SSL, and a plurality of word lines $WL_0$ to $WL_n$ may be disposed on an active region of a semiconductor substrate. The word lines $WL_0$ to $WL_n$ may be disposed between the ground and string selection lines GSL and SSL. Bit lines $BL_0$ to $BL_m$ may be disposed on the word lines $WL_0$ to $WL_n$, and may cross the word lines $WL_0$ to $WL_n$. The bit lines $BL_0$ to $BL_m$ may be connected to the active region at one side of the string selection line SSL. A common source line CSL parallel to the word lines $WL_0$ to $WL_n$ may be disposed on the active region at one side of the ground selection line GSL.

Figure 2:
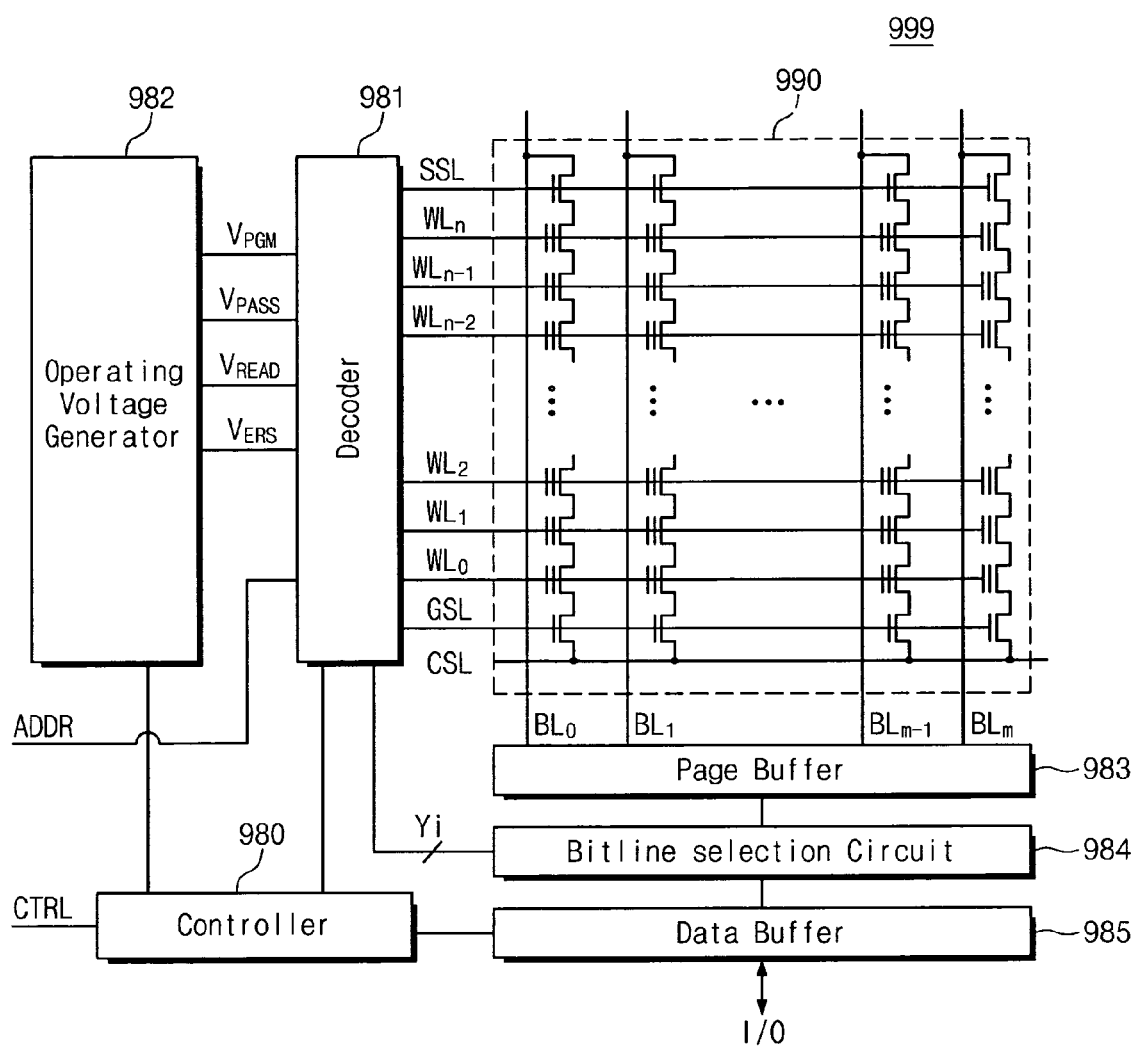
FIG. 2 illustrates a block diagram of a structure of a NAND flash memory device according to an example embodiment.

FIG. 2 illustrates a block diagram of a structure of a NAND flash memory device according to an example embodiment. Referring to FIG. 2, a NAND flash memory device 999 may include a memory cell array 990, a decoder 981, an operating voltage generator 982, a page buffer 983, a bit line selection circuit 984, a data buffer 985, and a controller 980.

The memory cell array 990, e.g., the memory cell array illustrated in FIG. 1, may include a plurality of memory blocks. Each memory block may include a plurality of pages (e.g., 32 pages or 64 pages), and each page may include a plurality of memory cells (e.g., 512 Byte or 2K Byte) sharing one word line. In a case of a NAND flash memory, an erase operation may be performed by a memory block unit, and read/write operations may be performed by a page unit.

The decoder 981 may be connected to the memory cell array 990 through the word lines $WL_0$ to $WL_n$, and may be controlled by the controller 980. The decoder 981 may receive an address signal ADDR from a memory controller (not shown), and may generate a select signal Yi to select a predetermined word line or a predetermined bit line.

The page buffer 983 may be connected to the memory cell array 990 through the bit lines $BL_0$ to $BL_m$, and may store data loaded from the data buffer 985. Data of one page may be loaded into the page buffer 983, and the loaded data may be simultaneously programmed into a selected page (e.g., page 1) during a program operation. Continuously, the page buffer 983 may read data from the selected page (e.g., page 1) during a read operation, and may store the read data therein temporarily. The data stored in the page buffer 983 may be transferred into a memory controller (not shown) in response to a read enable signal (not shown).

The bit line selection circuit 984 may select a bit line in response to the select signal Yi. The data buffer 985 may be an input/output buffer used for data transmission between the memory controller (not shown) and the NAND flash memory 999. The controller 980 may receive a control signal CTRL from the memory controller, and may control an internal operation of the NAND flash memory 999. The operating voltage generator 982 may generate various voltages used for an operation of the memory cell array 999 in response to the controller 980.

Figure 3:
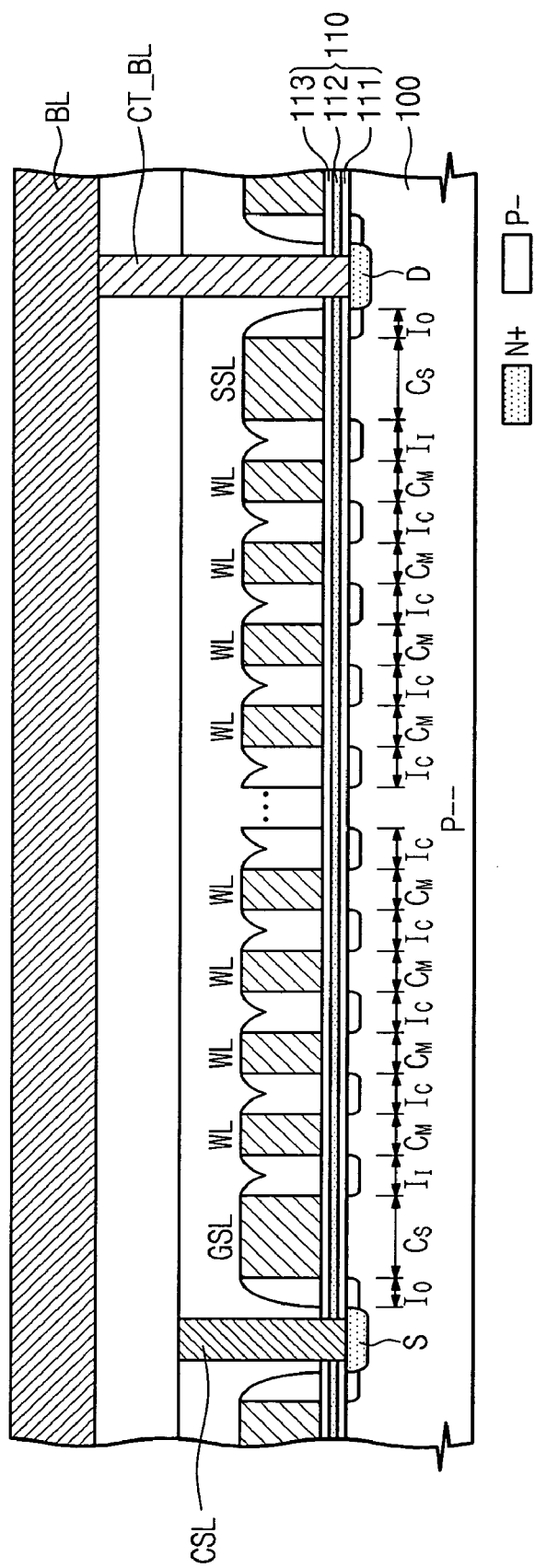
FIG. 3 illustrates a cross-sectional view of a portion of a cell array of a NAND flash memory device according to an example embodiment.

FIG. 3 illustrates a cross-sectional view of a portion of a cell array of a NAND flash memory device according to an example embodiment. A semiconductor substrate 100 may include a cell array region, as illustrated in FIG. 3, and a peripheral circuit region positioned peripherally with respect to the cell region (not shown). An active region, where active devices, e.g., a transistors, are formed, and a device isolation layer defining the active region may be disposed in the cell array region and in the peripheral circuit region.

Referring to FIG. 3, a pair of selection lines, i.e., the ground selection line GSL and the string selection line SSL, and the plurality of word lines WL interposed between the pair of selection lines may be formed on the semiconductor substrate 100. The word lines WL may be used as gate electrodes of memory cell transistors, and the selection lines GSL and SSL may be used as gate electrodes of selection transistors. The memory cell transistors and selection transistors may be formed on the active region of the cell array region. The memory cell transistors and selection transistors may be connected in series to define a unit memory string.

In detail, gate electrodes of the selection transistors may be connected to the selection lines (e.g., a string selection line SSL and a ground selection line GSL) crossing over the active region, and gate electrodes of the memory cell transistors may be connected to word lines WL disposed between the selection lines SSL and GSL. The selection lines SSL and GSL and the word lines WL of the unit memory string may define a unit gate structure.

An information storage layer 110 may be formed on the semiconductor substrate 100. The information storage layer 110 may include a tunnel insulation layer 111, a charge storage layer 112, and a blocking insulation layer 113 sequentially formed on the semiconductor substrate 100. The information storage layer 110 may be interposed between the word lines WL and the substrate 100, e.g., the word lines WL may be directly on the blocking insulation layer 113. The information storage layer 110 may extend between the word lines WL or the selection lines GSL and SSL and the semiconductor substrate 100.

As illustrated in FIG. 3, at the both sides of the unit memory string, a source region S and a drain region D may be formed in the semiconductor substrate 100. In other words, the word lines WL and the selection lines GSL and SSL may be formed between the source region S and the drain region D. For example, as illustrated in FIG. 3, the source region S may be formed at a first edge of the unit memory string to be adjacent to the ground selection line GSL, and the drain region D may be formed at a second edge of the unit memory string, i.e., an edge opposite the first edge, to be adjacent to the string selection line SSL. The source region S and the drain region D may be spaced apart from the ground selection line GSL and the string selection line SSL, respectively. The source and drain regions S and D may have a different conductivity type than the semiconductor substrate 100. The source region S and the drain region D may have a substantially same doping profile, and may have a higher impurity concentration than the semiconductor substrate 100.

The source region S of the unit memory string may be connected to a common source line CSL parallel to the ground selection line GSL, and the drain regions D of each unit memory string may be connected to respective, i.e., different, bit lines BL. Each drain region D and a corresponding bit line BL may be electrically connected to each other through a bit line plug CT_BL interposed therebetween.

According to an example embodiment, at least one impurity region having a same conductivity type as the semiconductor substrate 100 may be formed in the active region between the word lines WL and on both sides of the selection lines GSL and SSL, as illustrated in FIG. 3. For example, as illustrated in FIG. 3, cell impurity regions $I_C$ may be formed in the active region between the word lines WL, e.g., one cell impurity region $I_C$ may be formed in the semiconductor substrate 100 between every two adjacent word lines WL. As further illustrated in FIG. 3, outer and inner selection impurity regions $I_O$ and $I_1$ may be formed in active regions at both sides of the selection lines GSL and SSL. For example, as illustrated in FIG. 3, the outer selection impurity region $I_O$ may be formed in the active region between the source region S and the ground selection line GSL and in the active region between the drain region D and the string selection line SSL. As further illustrated in FIG. 3, the inner selection impurity region $I_I$ may be formed in the active region between each of the selection line GSL and SSL, and a corresponding adjacent word line WL, e.g., between the ground selection line GSL and a word line WL adjacent thereto.

The cell and selection impurity regions $I_C$, $I_O$, and $I_I$ may have the same conductivity type as the semiconductor substrate 100 (or a well region) but may have a higher net impurity concentration than the semiconductor substrate 100 (or a well region). That is, the cell and selection impurity regions $I_C$, $I_O$, and $I_I$ may have the same conductivity type as a cell channel regions $C_M$ (or a memory channel region) below the word lines WL and as a selection channel regions $C_S$ below the selection lines GSL and SSL, but may have a higher net impurity concentration than the cell and selection channel regions $C_M$ and $C_S$. The net impurity concentration within each channel region, e.g., cell channel regions $C_M$, may be non-uniform, e.g., the net impurity concentration within each channel may gradually increase with respect to an increasing horizontal distance from a center of the memory channel. In other words, the net impurity concentration in a peripheral portion of each memory channel region, e.g., a portion directly below a sidewall of the word line WL, may be higher than the net impurity concentration in a central portion of the memory channel region, e.g., a portion corresponding to a center portion of the word line WL.

In this respect, it is noted that a "net impurity concentration" may be defined as a difference between an absolute value of p-type concentration and an absolute value of n-type concentration. It is further noted that regions "below" elements may refer to regions completely overlapping the corresponding element, e.g., positioned directly under the elements.

The cell and selection impurity regions $I_C$, $I_O$, and $I_I$ may be field effect source/drain regions. In more detail, if the cell and selection impurity regions $I_C$, $I_O$, and $I_I$ are inversed by a fringe field caused by a voltage applied to an adjacent word line WL or selection lines GSL and SSL, the cell and selection impurity regions $I_C$, $I_O$, and $I_I$ may be used as source/drain electrodes of a corresponding transistor. For example, the inner and outer selection impurity regions $I_O$ and $I_I$ may be field effect source/drain electrodes of a selection transistor corresponding to the ground selection line GSL, and/or two cell impurity regions $I_C$ may be field effect source/drain electrodes of a cell memory transistor therebetween.

Since the cell and selection impurity regions $I_C$, $I_O$, and $I_I$ may have a higher net impurity concentration than the cell and selection channel regions $C_M$ and $C_S$, the cell and selection impurity regions $I_C$, $I_O$, and $I_I$ may have a higher threshold voltage than the cell and selection channel regions $C_M$ and $C_S$. That is, the cell and selection impurity regions $I_C$, $I_O$, and $I_I$ may be inversed at a higher voltage than the cell and selection channel regions $C_M$ and $C_S$. Accordingly, even if a fringe field by a word line is increased due to high integration, leakage current may not increase because a transistor including field effect source/drain electrodes may have a substantially increased effective channel length, thereby suppressing a short channel effect. In other words, because the selection impurity regions $I_O$ and $I_I$ of the selection transistors in an example embodiment may define field effect source/drain electrodes, leakage current increase due to short channel effect and program disturbance according thereto can be substantially reduced.

Figure 4:
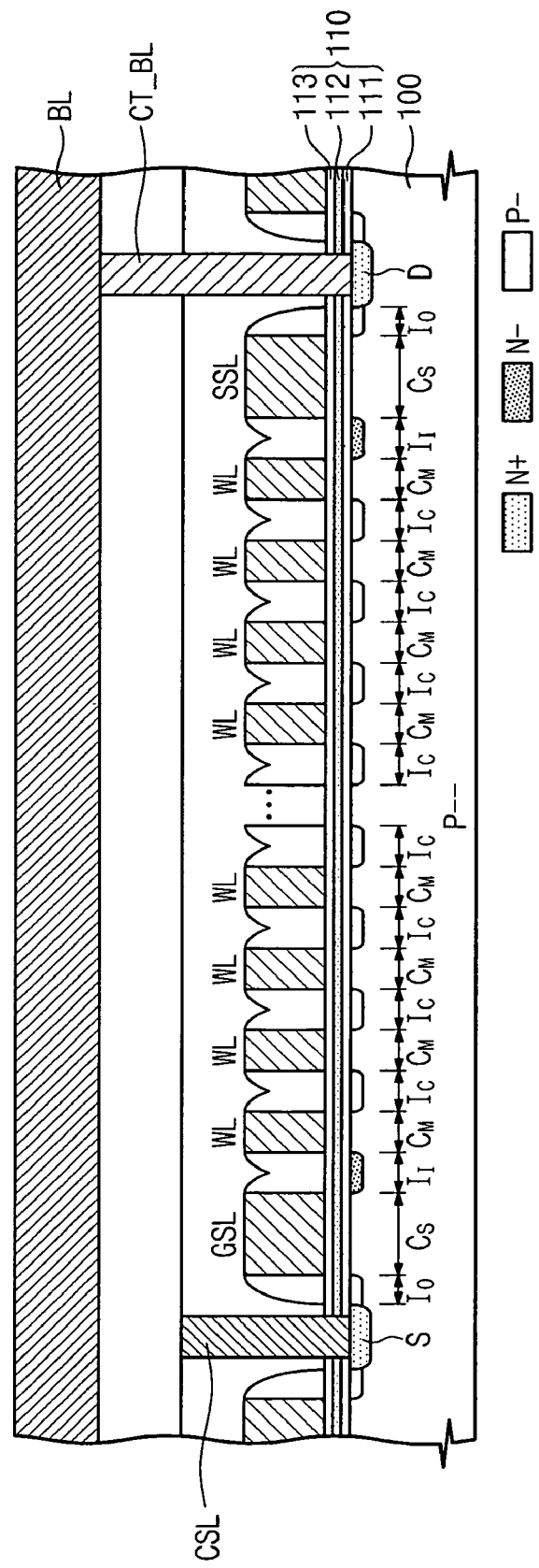
FIGS. 4-10 illustrate cross-sectional views of a portion of a cell array of a NAND flash memory device according to other example embodiments.

FIG. 4 illustrates a cross-sectional view of a portion of a cell array of a NAND flash memory device according to another example embodiment. The NAND flash memory device of FIG. 4 may be substantially the same as the NAND flash memory device of FIG. 3, with the exception of a difference in a conductivity type of the inner selection impurity region $I_I$. Accordingly, overlapping description will be omitted for conciseness.

Referring to FIG. 4, at least one inner selection impurity region $I_I$ formed in an active region between the selection lines GSL and SSL and a word line WL adjacent thereto may have a different conductivity type than the conductivity type of the semiconductor y substrate 100 (or a well region), but may have a higher net impurity concentration than the semiconductor substrate 100 (or a well region). Consequently, at least the one inner selection impurity region $I_I$, i.e., the inner selection impurity region $I_I$ having a different conductivity type with respect to the semiconductor substrate 100, may define a p-n junction source/drain structure, while the corresponding outer selection impurity region $I_O$ may define the field effect source/drain structure described previously with reference to FIG. 3. In other words, at least one selection transistor of the NAND flash memory device of FIG. 4 may have different source/drain structures, so one source/drain structure of the selection transistor, i.e., a source/drain adjacent to a word line WL, may have a p-n junction structure and another source/drain of the selection transistor, e.g., a source/drain adjacent to the drain region D, may have a field effect structure. Since the inner selection impurity region $I_I$ may allow boosted voltages of a channel region of a selection transistor and a memory cell that is the most adjacent thereto to gradually change, program disturbance characteristic of the selection transistor may be substantially reduced.

Figure 5:
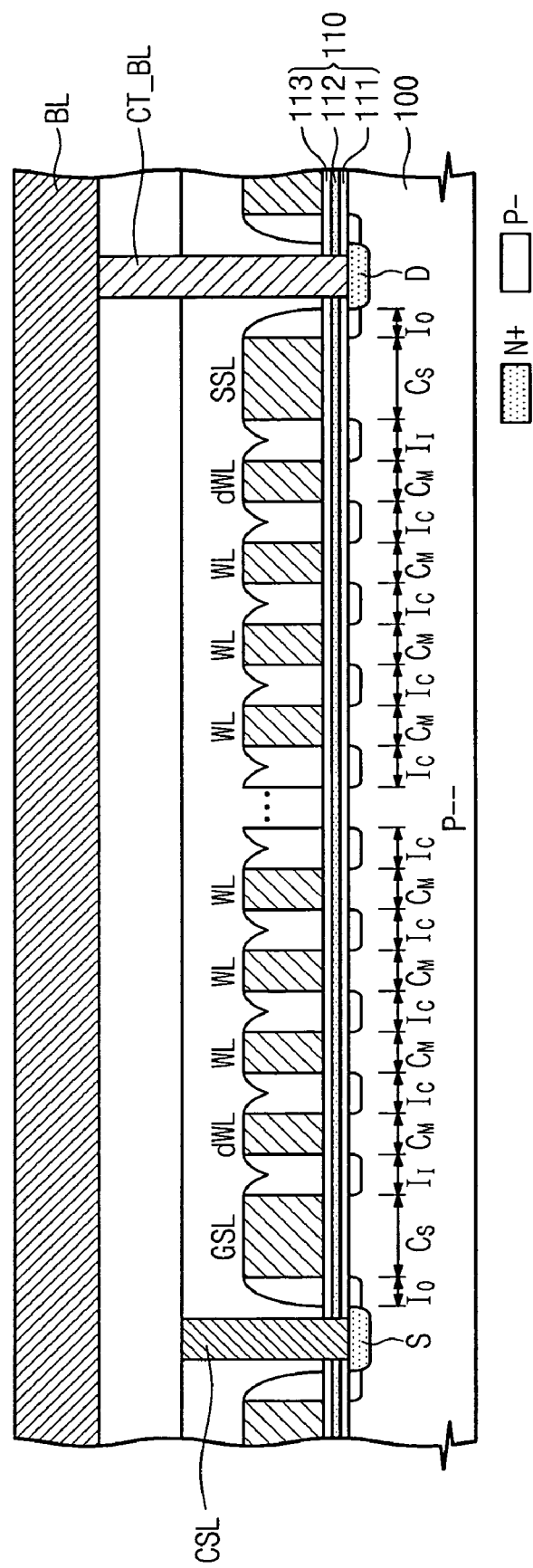
Figure 6:
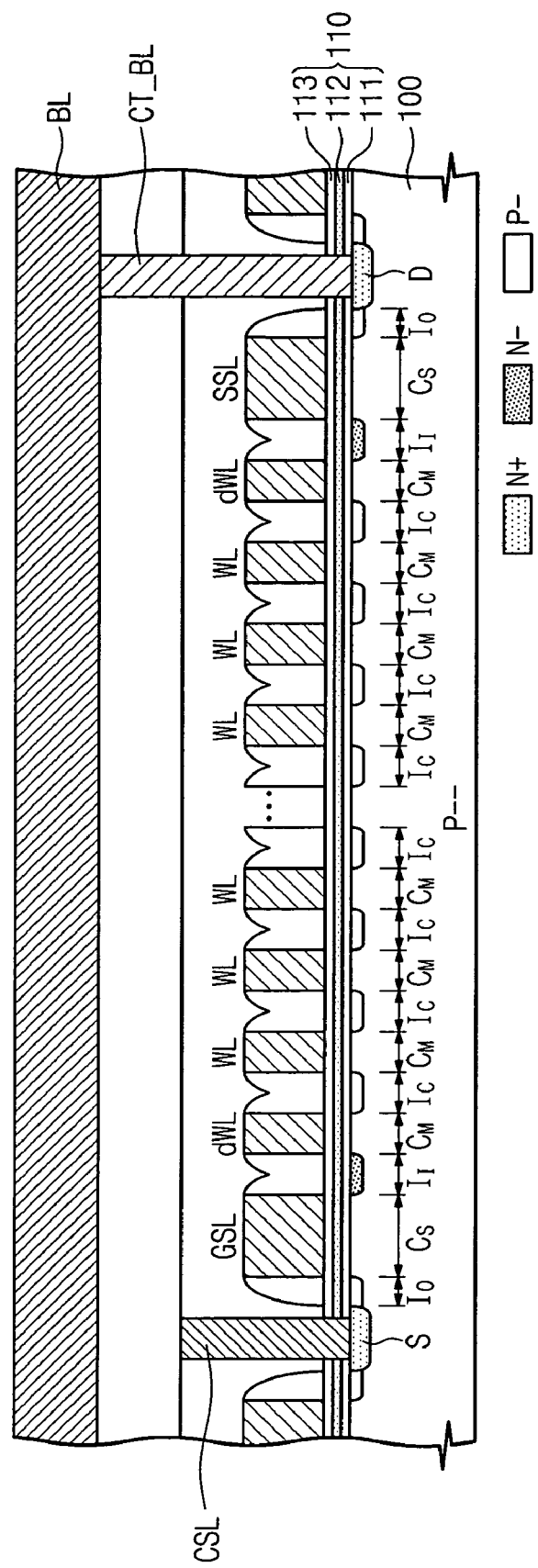

FIGS. 5 and 6 illustrate cross-sectional views of a portion of a cell array of a NAND flash memory device according to another example embodiment. The NAND flash memory devices of FIGS. 5 and 6 may be substantially the same as the NAND flash memory devices of FIG. 4, with the exception of having at least one dummy word lines dWL. Accordingly, overlapping description will be omitted for conciseness.

Referring to FIGS. 5 and 6, at least one dummy word line dWL may be positioned adjacent to a selection line. For example, as illustrated in FIGS. 5 and 6, one dummy word line dWL may be immediately adjacent to each of the selection lines GSL and SSL. That is, in the gate structure, at least one of dummy word lines dWL may be disposed between at least one of the selection lines GSL and SSL and a word line WL adjacent thereto. It is noted that since the dummy word line dWL may not define a memory cell transistor for storing information, the dummy word line dWL may be different from the word line WL, e.g., in terms of functionality. However, the dummy word line dWL may be substantially identical to the word line WL in terms of its structure. Therefore, (8*n+2) gate lines may be disposed between the selection lines GSL and SSL (n is a natural number).

As illustrated in FIG. 5, an impurity region may be formed in the active region at both sides of the dummy word line dWL. A doping profile of the dummy word line dWL may be substantially the same as a doping profile of a word line WL. For example, as illustrated in FIG. 5, the impurity regions formed in the active region at both sides of the dummy word line dWL may be substantially identical to the cell impurity region $I_C$ and the inner selection impurity region $I_I$, respectively. In other words, the impurity regions formed in the active region at both sides of the dummy word line dWL may have a substantially same conductivity type as the semiconductor substrate 100 or the cell channel region $C_M$, but may have a higher impurity concentration than the semiconductor substrate 100 or the cell channel region $C_M$. Consequently, the impurity regions at both sides of the dummy word line dWL may define the field effect source/drain structure described previously with reference to FIG. 3.

As illustrated in FIG. 6, an inner selection impurity region $I_I$ may be formed in the active region between each of the dummy word lines dWL and a corresponding adjacent selection line GSL and SSL. The inner selection impurity region $I_I$ may have a different conductivity type than the semiconductor substrate 100 or the cell channel region $C_M$, but may have a higher net impurity concentration than the semiconductor substrate 100 or the cell channel region $C_M$. Consequently, the inner selection impurity region $I_I$ formed in the active region between the dummy word lines dWL and the selection lines GSL and SSL may define a source/drain having a p-n junction structure. Therefore, as described previously with reference to FIG. 4, the inner selection impurity regions $I_I$ may define source/drain electrodes of p-n junction structure and the outer selection impurity regions 10 formed in the active region between the selection lines GSL and SSL and the source/drain regions S and D, respectively, may define a field effect source/drain structure.

Figure 7:
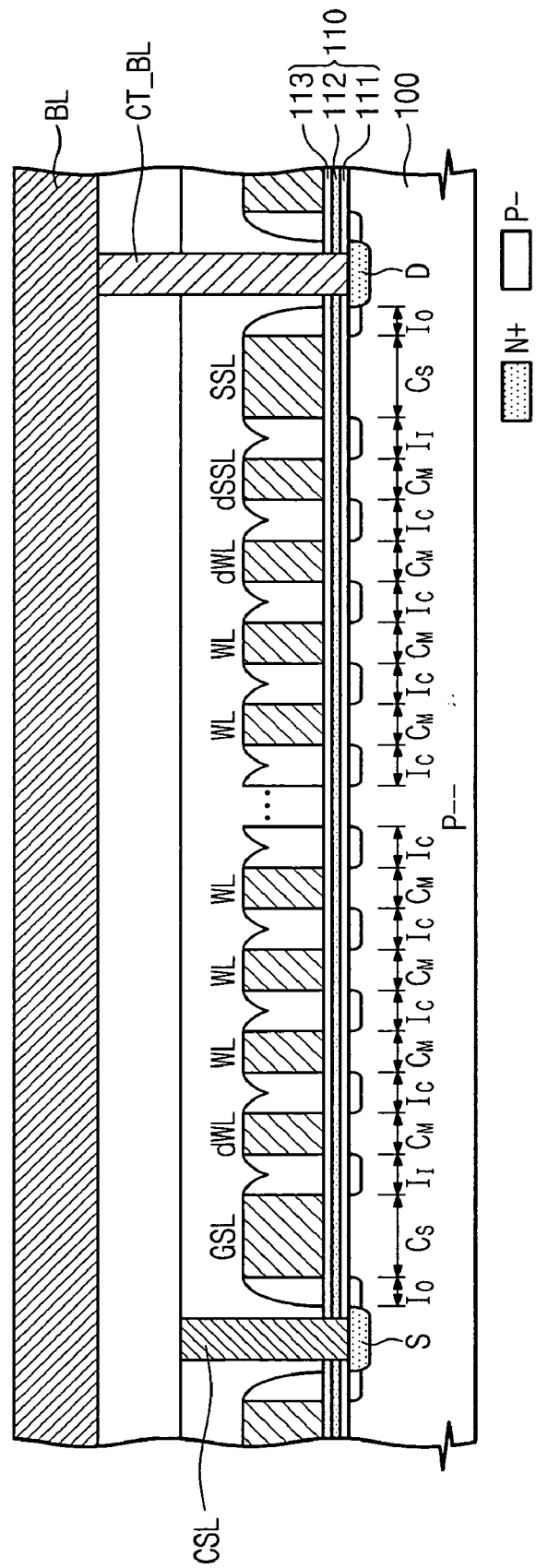
Figure 8:
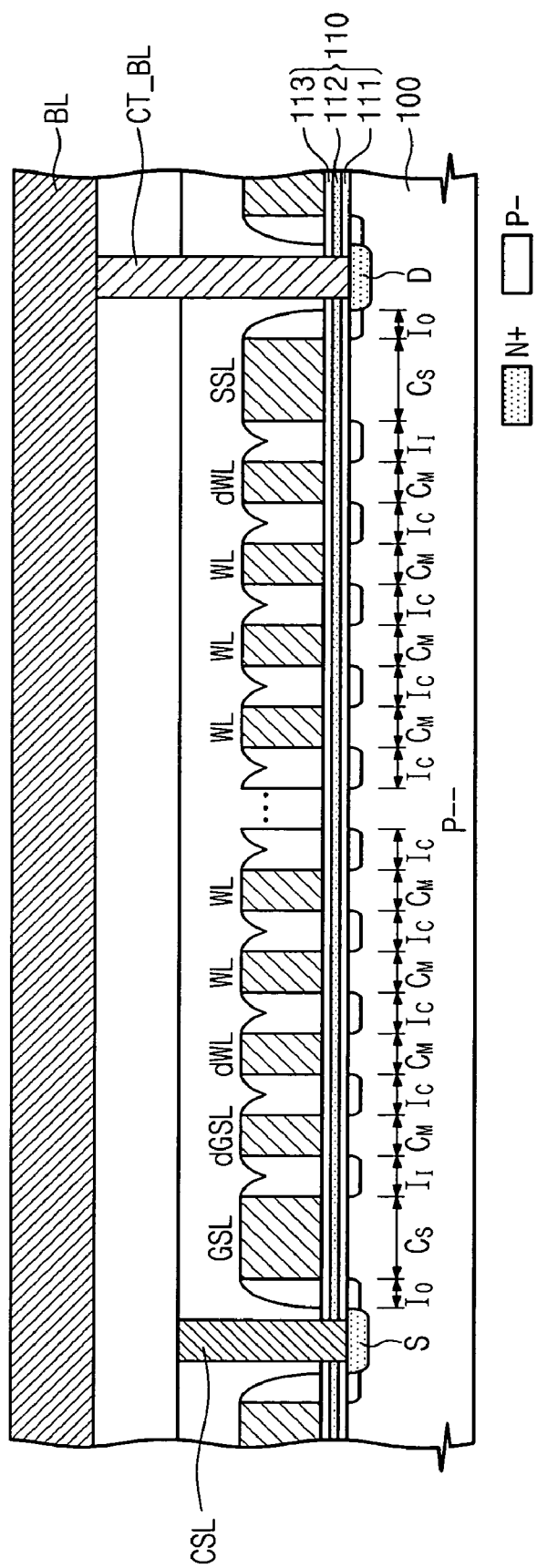
Figure 9:
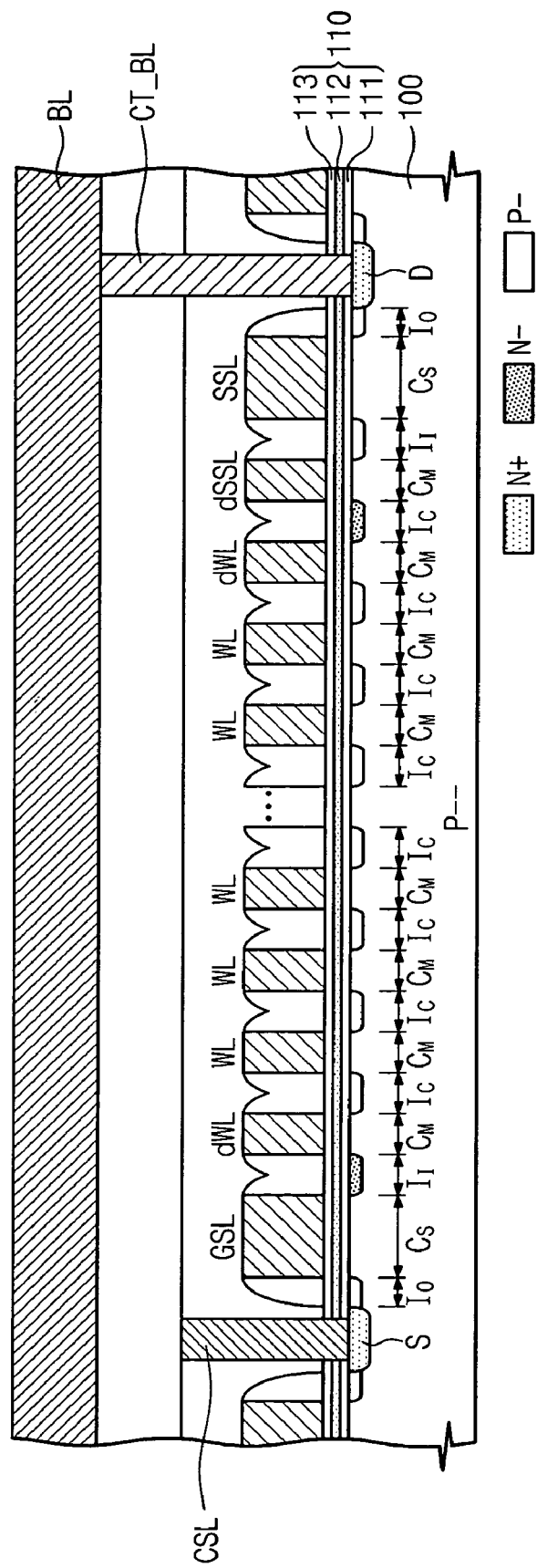

FIGS. 8 and 9 illustrate cross-sectional views of a portion of a cell array of a NAND flash memory device according to another example embodiment. The NAND flash memory devices of FIGS. 7 and 8 may be substantially the same as the NAND flash memory devices of FIG. 5, with the exception of having at least one of dummy, i.e., auxiliary, selection lines dGSL and dSSL. Accordingly, overlapping description will be omitted for conciseness.

Referring to FIGS. 7 and 8, at least one of the dummy selection lines dSSL and dGSL may be disposed between at least one of the respective selection lines GSL and SSL and a corresponding word line WL adjacent thereto. For example, a dummy string selection line dSSL connecting the string selection line SSL with the word line WL in series may be disposed at one side of the string selection line SSL, as illustrated in FIG. 7. As illustrated in FIG. 8, a dummy ground selection line dGSL connecting in series the ground selection line GSL with the word line WL adjacent thereto may be disposed at one side of the ground selection line GSL. As further illustrated in FIGS. 7 and 8, each of the dummy selection lines dSSL and dGSL may be between a dummy word line dWL and a corresponding one of the selection lines SSL and GSL. It is noted, however, that the dummy selection lines dSSL and dGSL may be used without using the dummy word lines dWL.

Continuously, an impurity region may be formed in the active region at both sides of the dummy selection line dSSL or dGSL. The impurity region may have a doping profile that is substantially identical to that of the cell impurity region $I_C$ formed in an active region between the word lines WL. That is, an impurity region formed in the active regions at both sides of the dummy selection lines dGSL or dSSL may have the same conductivity type as the semiconductor substrate 100 or the cell channel region $C_M$, but may have a higher impurity concentration than the semiconductor substrate 100 or the cell channel region $C_M$. Consequently, the impurity region may be a field effect source/drain structure.

As mentioned above, the string selection line SSL or the ground selection line GSL may be disposed in series to the dummy string selection line dSSL or the dummy ground selection line dGSL, which may be adjacent to the string selection line SSL or the ground selection line GSL. Therefore, a selection transistor including the above lines may have a substantially increased effective channel length. Accordingly, short channel effect, e.g., punch-through, may be prevented or substantially minimized in the above-mentioned structure. Further, because an impurity region formed in active regions at both sides of the dummy selection line dSSL or dGSL may define a field effect source/drain structure, the short channel effect may be minimized even further.

It is noted that according to an example embodiment, a gate pattern structure may include an odd number of lines. In more detail, if the gate pattern structure is formed using a double patterning technique, the number of formed lines may be an odd number. In this case, as illustrated in the FIGS. 7 and 8, the dummy selection line dGSL or dSSL may be selectively formed at one side of the selection line GSL or SSL.

Figure 10:
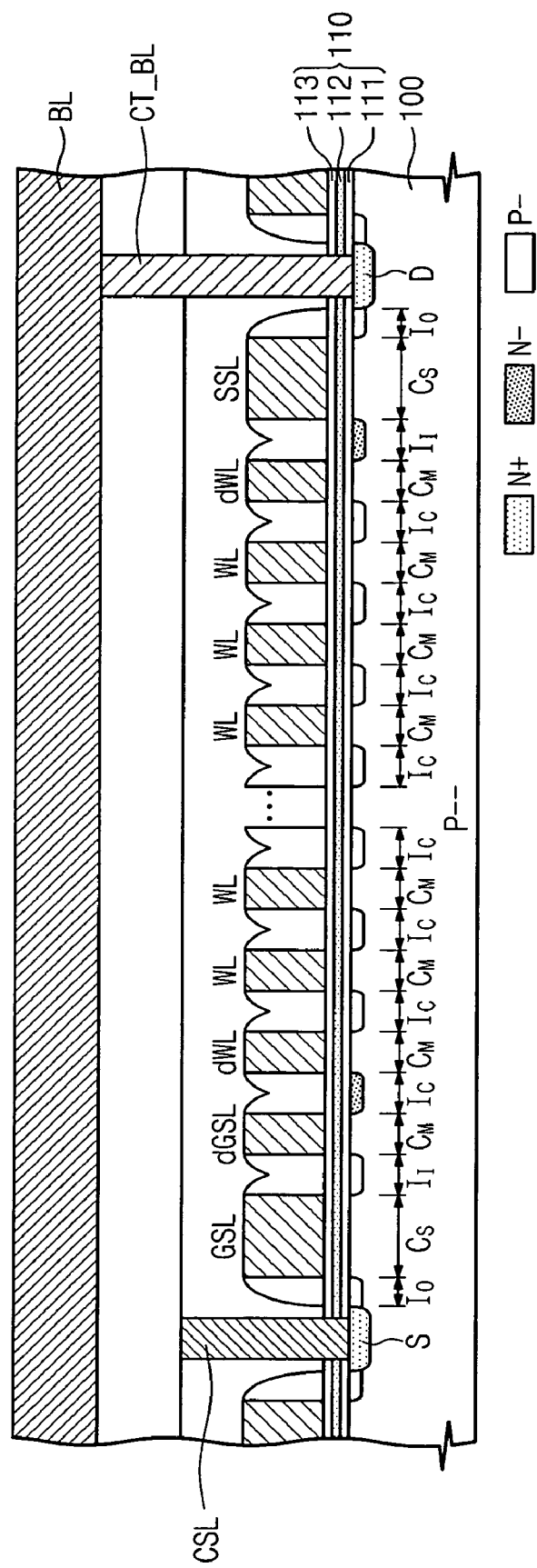

FIGS. 9 and 10 illustrate cross-sectional views of a portion of a cell array of a NAND flash memory device according to another example embodiment. The NAND flash memory devices of FIGS. 9 and 10 may be substantially the same as the NAND flash memory devices of FIGS. 7 and 8, respectively, with the exception of a difference in a conductivity type of at least one impurity region. Accordingly, overlapping description will be omitted for conciseness.

Referring to FIGS. 9 and 10, at least one impurity region may be formed in active regions between the dummy selection line dSSL or dGSL and the dummy word line dWL adjacent thereto. The impurity region may have a different conductivity type than the semiconductor substrate 100 or the cell channel region $C_M$, and may have a higher net impurity concentration than the semiconductor substrate 100 or the cell channel region $C_M$. Consequently, the impurity region may be (constituting a substrate and p-n junction) formed in the active region between the dummy selection line dSSL or dGSL and the dummy word line dWL, and may define a source/drain region of a p-n junction structure. An opposite impurity region, i.e., an impurity region formed in an active region between the dummy selection line dSSL and the selection line SSL or between the dummy selection line dGSL and the selection line GSL, may define field effect source/drain structure, as discussed previously with reference to FIG. 4.

The string selection line SSL or the ground selection line GSL may be disposed in series to the dummy string selection line dSSL or the dummy ground selection line dGSL, which may be adjacent to the string selection line SSL or the ground selection line GSL. Therefore, a selection transistor including the above lines may have a substantially increased effective channel length. Accordingly, short channel effect, e.g., punch-through, may be prevented or substantially minimized. Further, because an impurity region between the dummy selection line dSSL or dGSL and the selection line SSL or GSL may be a field effect source/drain structure, the short channel effect may be minimized even further.

In contrast, when a conventional semiconductor device includes channel regions and source/drain regions having substantially same net impurity concentrations, threshold voltages of the channel and source/drain regions may be substantially the same. When a degree of integration of the NAND flash memory increases, i.e., when an interval between adjacent word lines is reduced, fringe field by a word line may be substantially increased, thereby increasing leakage current of the memory cell. When the leakage current of the memory cell is increased, an off-state of the memory cell, i.e., when a selection transistor is set to indicate an unselected cell, may be erroneously registered as an on-state, thereby causing faulty operation of the memory device.

Accordingly, as described previously, a semiconductor device according to example embodiments may include source/drain regions with higher net impurity concentrations than corresponding channel regions, so threshold voltages of the source/drain regions may have higher threshold voltages than the corresponding channel regions. Accordingly, leakage current of the memory device may be substantially reduced.

Figure 11:
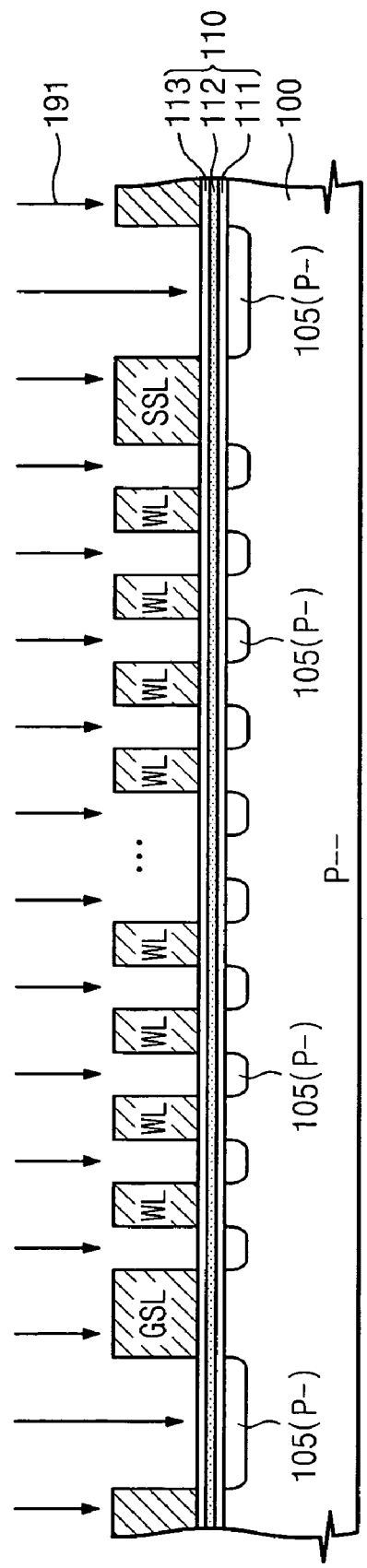
FIG. 11 illustrates a cross-sectional view of a method of fabricating a NAND flash memory device according to an example embodiment.

FIG. 11 illustrates a cross-sectional view of a method of fabricating a NAND flash memory device according to an example embodiment.

Referring to FIG. 11, a device isolation layer (see 102 of FIG. 13) may be formed in the semiconductor substrate 100 to define the active region, and the information storage layer 110 may be formed on the active region. Gate structures including word and selection liens crossing over the active region may be formed on the semiconductor substrate 100. As described previously with reference to FIG. 3, the information storage layer 110 may include the tunnel insulation layer 111, the charge storage layer 112, and the blocking insulation layer 113. Additionally, as described previously with reference to FIGS. 4 and 5, the gate structure may include a plurality of word lines WL and selection lines GSL and SSL. As described previously with reference to FIGS. 5 through 10, the gate structure may include dummy word lines dWL and dummy selection lines dGSL or dSSL.

The method of fabricating the NAND flash memory device according to the example embodiment may include forming an impurity region 105 in the active region through an ion implantation process 191. The gate structure may be used as an ion mask during the ion implantation process 191. Accordingly, the impurity region 105 may be selectively formed in the active region between lines WL, SSL, and GSL of the gate structure. According to this embodiment, the impurity region 105 may have the same conductivity type as the semiconductor substrate 100 or the channel region of a transistor, but may have a higher impurity concentration than the semiconductor substrate 100 or the channel region of the transistor, i.e., an active region below the lines WL, SSL, and GSL of the gate structure. For example, if the channel region of the semiconductor substrate 100 or the transistor is a p-type, the ion implantation process may include injection of p-type impurities, e.g., B or $BF_2$, into the active region.

Figure 12:
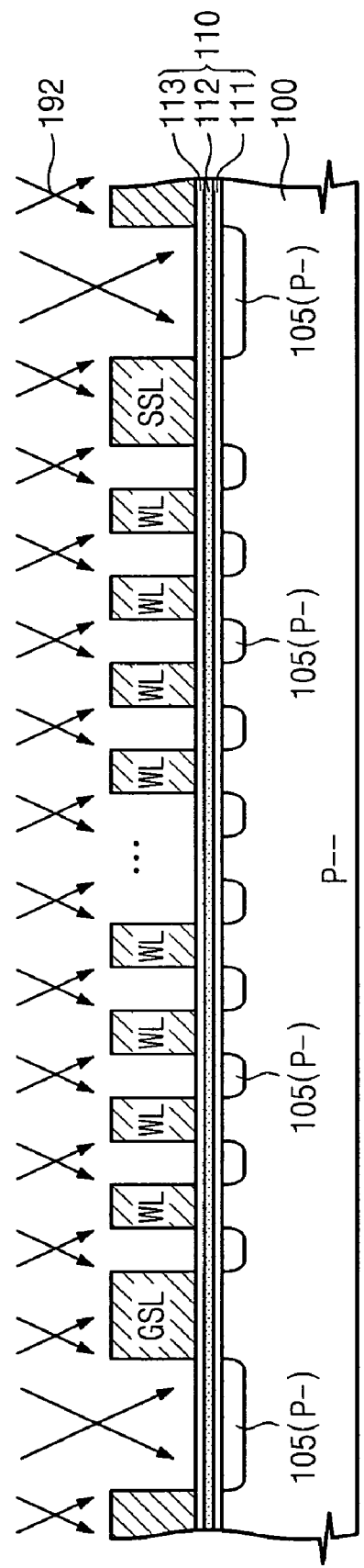
FIGS. 12-13 illustrate a cross-sectional view and a perspective view, respectively, of a method of fabricating a NAND flash memory device according to another example embodiment.
Figure 13:
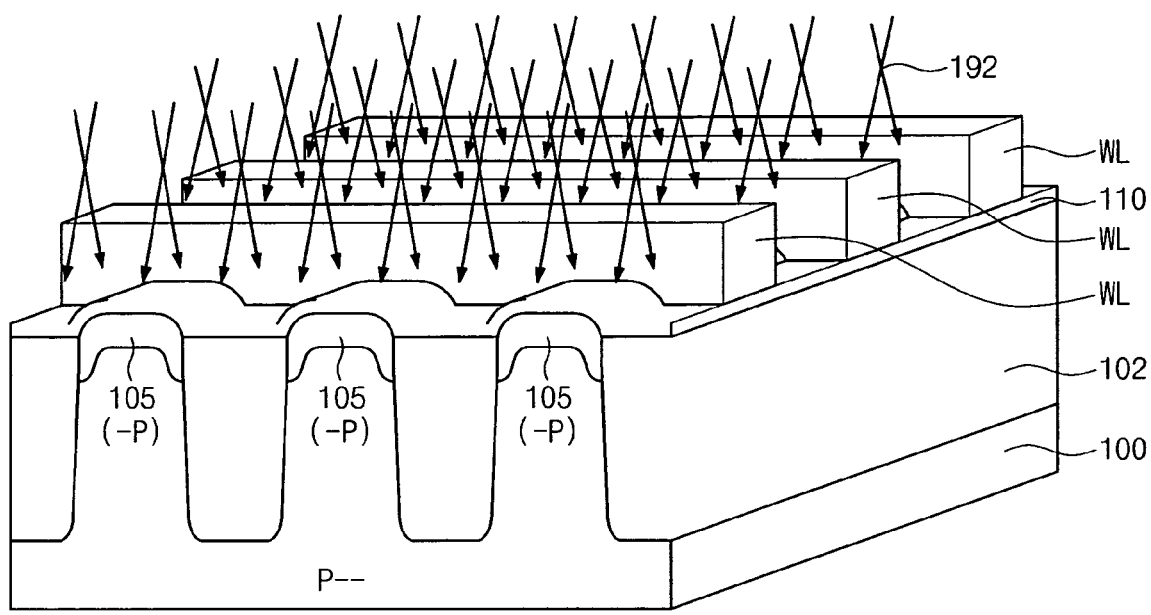

FIGS. 12 and 13 illustrate a cross-sectional view and a perspective view, respectively, of a method of fabricating a NAND flash memory device according to another embodiment.

Referring to FIGS. 12 and 13, according to this embodiment, an ion implantation process 192 for forming the impurity region 105 may implant impurity ions, e.g., B or $BF_2$ ions, on a top surface of the semiconductor substrate 100 at a slanted angle, i.e., not orthogonally to the top surface. For example, as illustrated in FIG. 13, a slanted ion implantation method may provide increased control over localized ion implantation, so ion beams may be directed toward regions where the impurity region 105 is to be formed.

Figure 14:
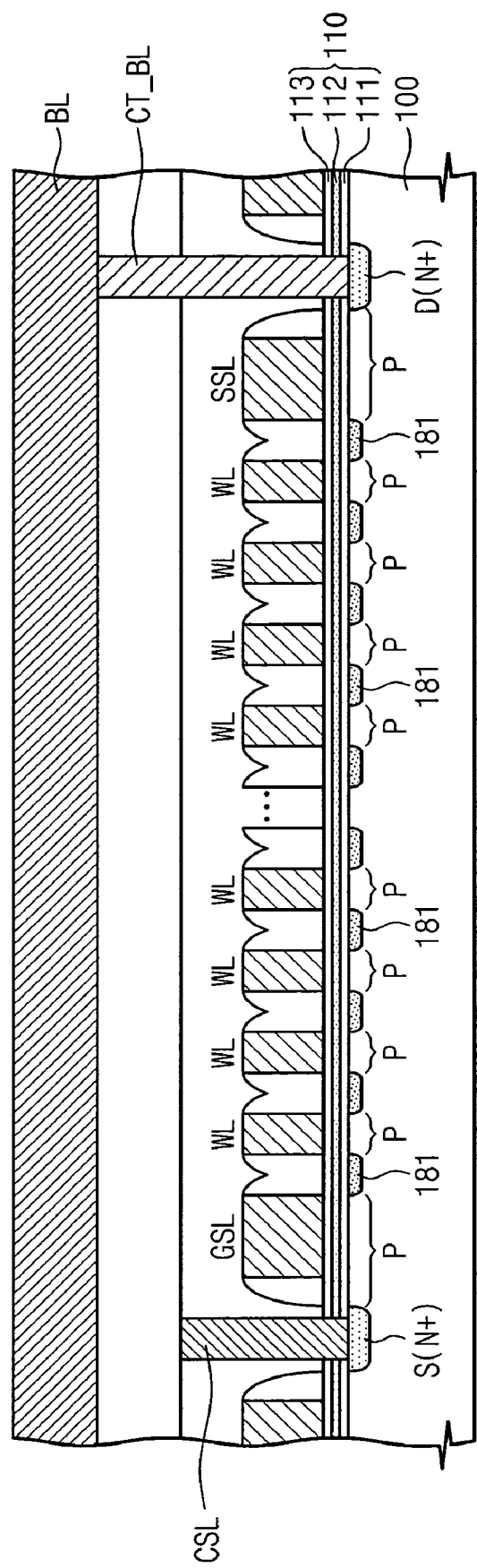
FIGS. 14-18 illustrate a cross-sectional views of a portion of a cell array of a NAND flash memory device according to other example embodiments.

FIG. 14 illustrates a cross-sectional view of a portion of a cell array of a NAND flash memory device according to another example embodiment. The NAND flash memory device of FIG. 14 may be substantially the same as the NAND flash memory device described previously with reference to FIG. 3, with the exception of different arrangements of some of the impurity regions. Accordingly, for conciseness, description of overlapping technical features will be omitted.

Referring to FIG. 14, a plurality of impurity regions 181 having a different conductivity type than the semiconductor substrate 100 or the cell channel region $C_M$ may be formed in the active region between the word lines WL, i.e., between memory cell transistors, and in the active region between the selection lines GSL and SSL and the word lines WL adjacent thereto, i.e., between a selection transistor and a memory cell transistor adjacent thereto. The source region S and drain region D may have a different conductivity type than the semiconductor substrate 100, and may be formed in the active regions below the common source line CSL and the bit line contact plug CT_BL. In addition to the high concentration region N+, the source region S and the drain region D may further include a low concentration region, as will be described in more detail with reference to FIGS. 22 and 24.

The active region between the source region S and the ground selection line GSL and the active region between the drain region D and the string selection line SSL may have the same conductivity type, e.g., p-type conductivity, as the cell channel region $C_M$. For example, as illustrated in FIG. 14, region P may overlap both the channel region directly under the ground selection line GSL and the active region under an outermost spacer of the ground selection line GSL. That is, the impurity region 181 formed between adjacent word lines WL may not be formed in the active region between the ground selection line GSL and the source region S. Similarly, the impurity region 181 may not be formed in the active region between the string selection line SSL and the drain region D. The source/drain regions S and D may be spaced apart from the selection lines GSL and SSL by using spacers formed on sidewalls of the selection lines GSL and SSL as a mask. Consequently, the selection transistor may have one field effect source/drain structure formed adjacent to the source/drain regions S and D and one source/drain structure of a p-n junction type formed adjacent to the word line WL. Accordingly, selection transistors may have a substantially increased effective channel length and an improved short channel effect suppressing characteristic, i.e., a substantially minimized short channel effect.

FIGS. 15 through 18 illustrate cross-sectional views of a portion of a cell array of a NAND flash memory device according to other example embodiments. The NAND flash memory devices of FIGS. 15-18 may be substantially the same as the NAND flash memory device of FIG. 14, with the exception of different arrangements of impurity regions therein. Accordingly, for conciseness, description of overlapping, i.e., substantially identical, technical features will be omitted.

Referring to FIGS. 15 through 18, the active region between the word lines WL, i.e., an entire region below and between all the word lines WL, may have the same conductivity type as the semiconductor substrate 100 or the channel region $C_M$. Consequently, impurity regions of the memory cell transistors, i.e., transistors using the word lines WL as gate electrodes, may define field effect source/drain structures therein. That is, the active region between adjacent word lines WL may have a substantially same doping profile and impurity concentration as the active region below, e.g., directly below, the word lines WL.

Figure 15:
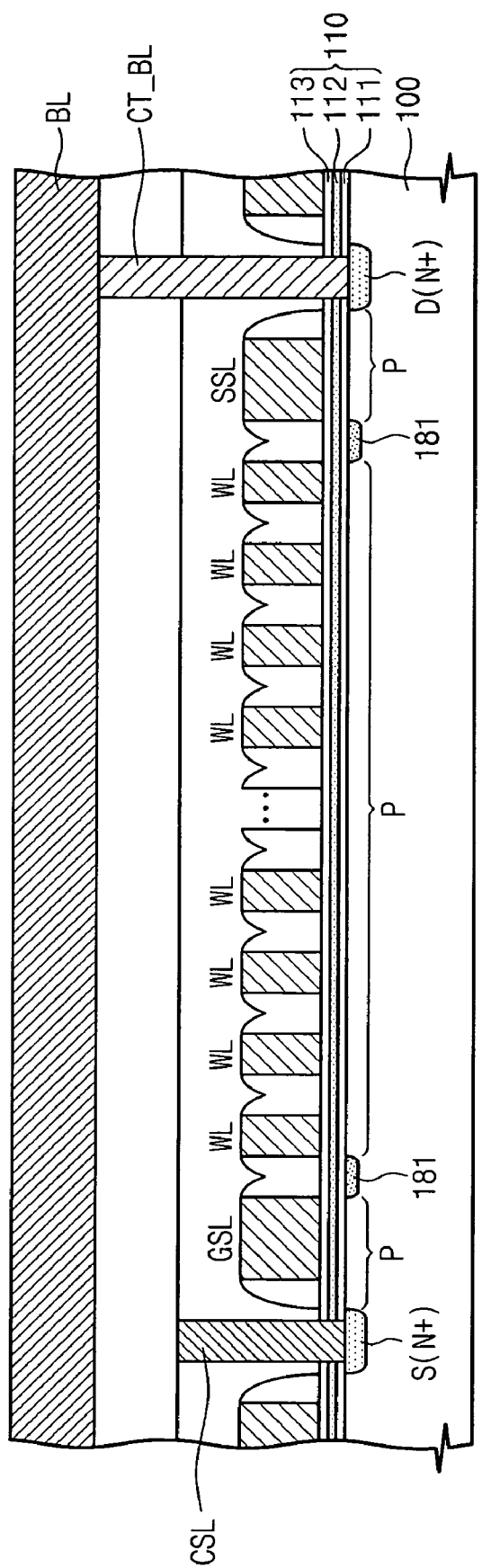

As illustrated in FIG. 15, impurity regions 181 having a different conductivity type than the semiconductor substrate 100 or the cell channel region $C_M$ may be formed in the active region between the selection lines GSL and SSL, e.g., each of the selection lines GSL and SSL, and an adjacent word line WL. In this case, the selection transistor may include a source/drain structure of a p-n junction type adjacent to the word line WL and a field effect source/drain structure adjacent to the source or drain region S or D, as described previously with reference to FIG. 4. Accordingly, the selection transistors of FIG. 15 may have a substantially increased effective channel length and improved short channel effect suppressing characteristics.

Figure 16:
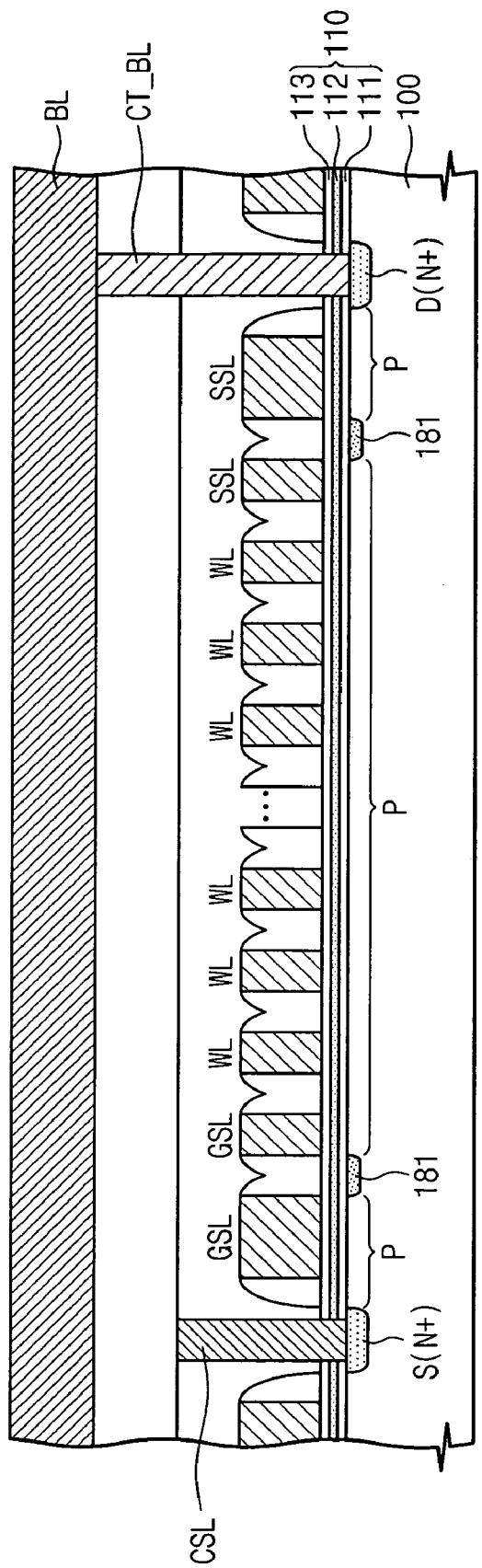
Figure 17:
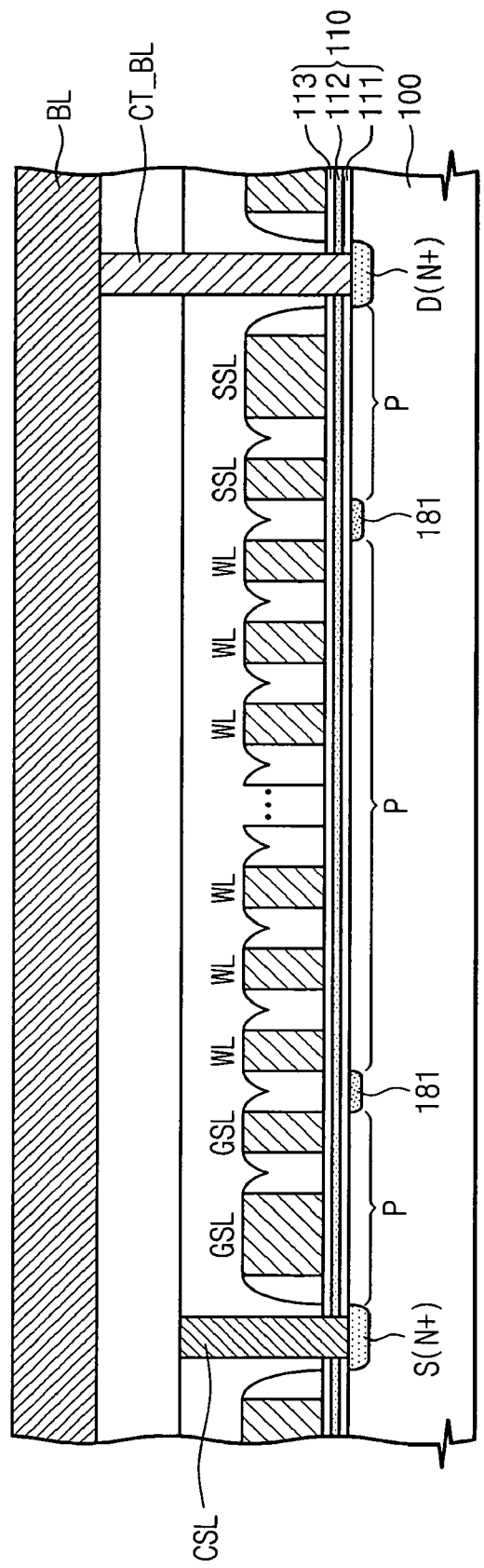
Figure 18:
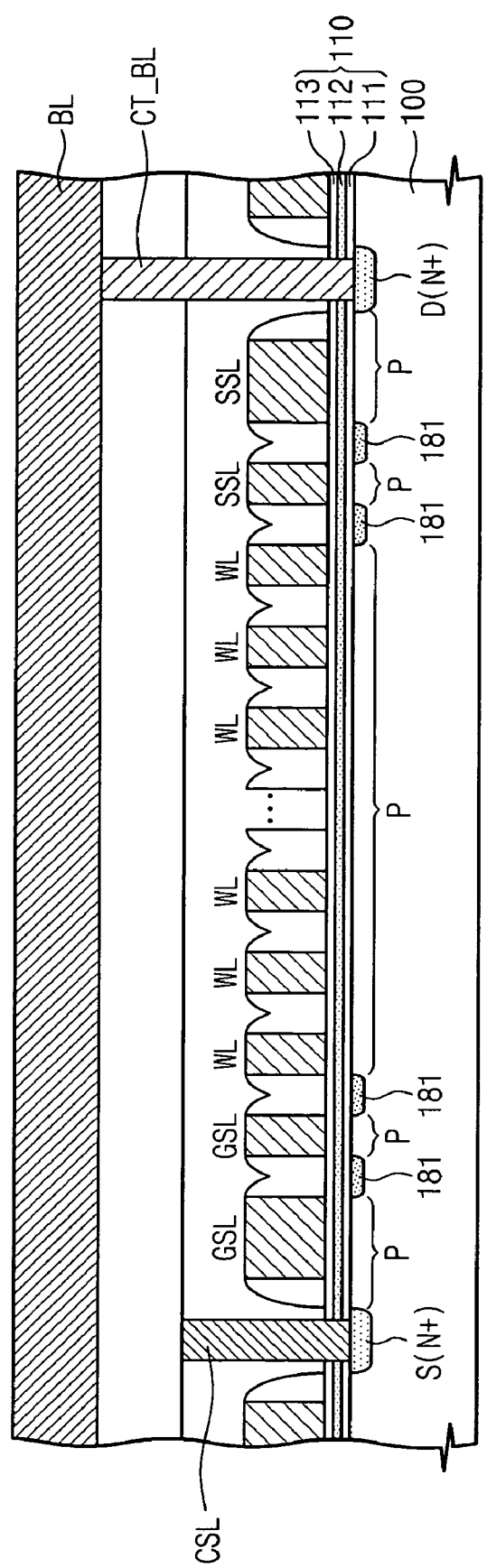

As illustrated in FIGS. 16-18, the NAND flash memory device may be substantially the same as described previously with reference to FIG. 15, with the exception of having a plurality of ground selection transistors connected in series between the source region S and the word line WL adjacent thereto, and a plurality of string selection transistors connected in series between the drain region D and the word line WL adjacent thereto. For example, as illustrated in FIGS. 16 through 18, a pair of ground selection lines GSL and a pair of string selection lines SSL may be respectively disposed between the common source line CSL and the word line WL adjacent thereto and between the bit line contact plug CT_BL and the word line WL.

For example, as illustrated in FIG. 16, impurity regions 181 having a different conductivity type than the semiconductor substrate 100 or the cell channel region $C_M$ may be formed in the active region between the pair of ground selection lines GSL and/or the active region between the pair of string selection lines SSL. In another example, as illustrated in FIG. 17, impurity regions 181 having a different conductivity type than the semiconductor substrate 100 or the cell channel region $C_M$ may be formed in the active region between the word line WL, i.e., at least one of the outermost word lines WL, and a corresponding selection line GSL or SSL adjacent thereto. In yet another example, as illustrated in FIG. 18, impurity regions 181 having a different conductivity type than the semiconductor substrate 100 or the cell channel region $C_M$ may be formed in the active region between the pair of ground selection lines GSL, in the active region between the pair of string selection lines SSL, and in the active region between the outermost word line WL and the selection line GSL or SSL adjacent thereto.

To reduce program disturbance due to short channel effect, as illustrated in FIGS. 14 through 18, an active region between the source region S and the ground selection line GSL and an active region between the drain region D and the string selection line SSL may have the same conductivity type, e.g., p-type, as the semiconductor substrate 100 or the cell channel region $C_M$.

Figure 19:
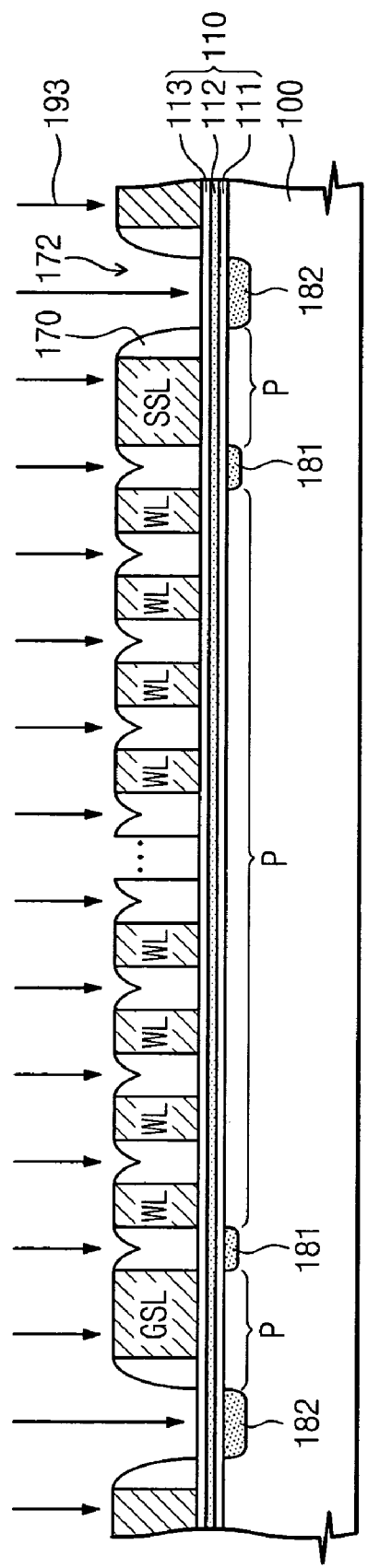
FIGS. 19-24 illustrate cross-sectional views of stages in a method of fabricating a NAND flash memory device according to another example embodiment.
Figure 20:
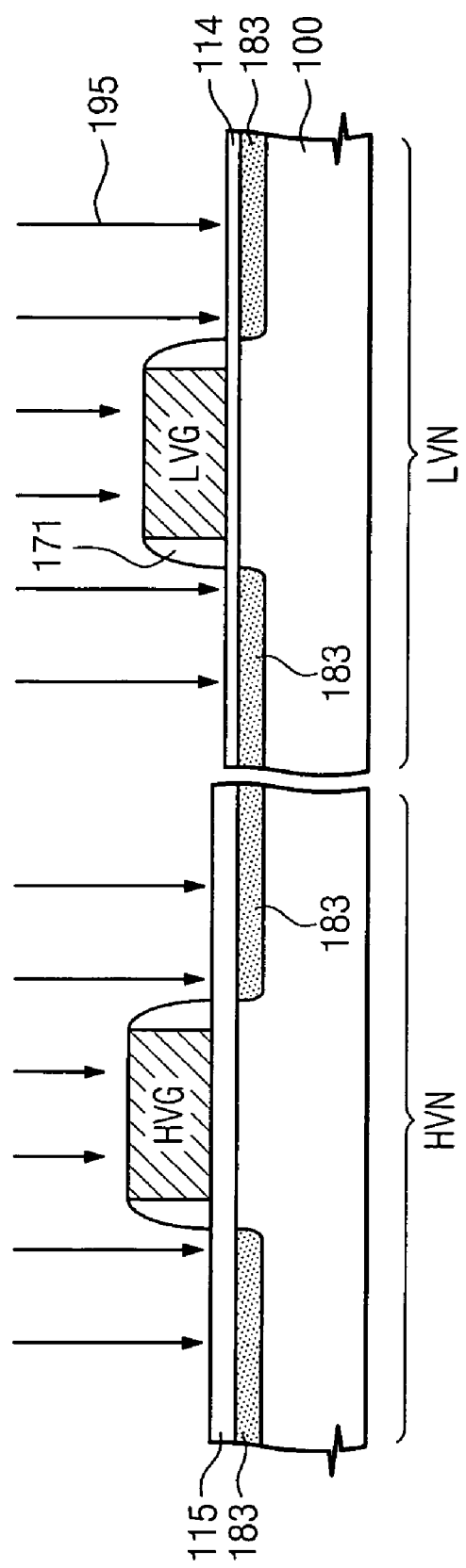
Figure 21:
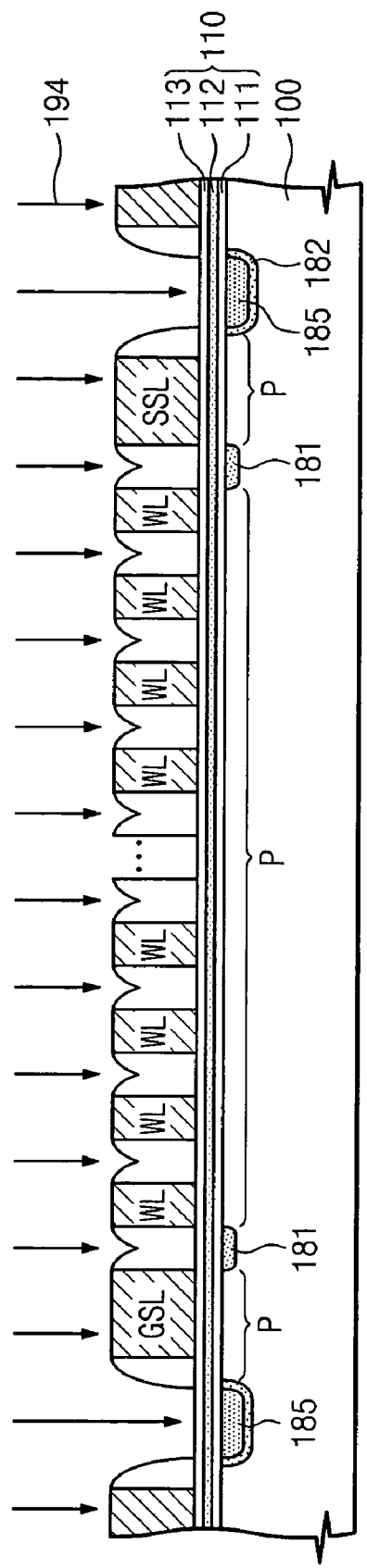
Figure 22:
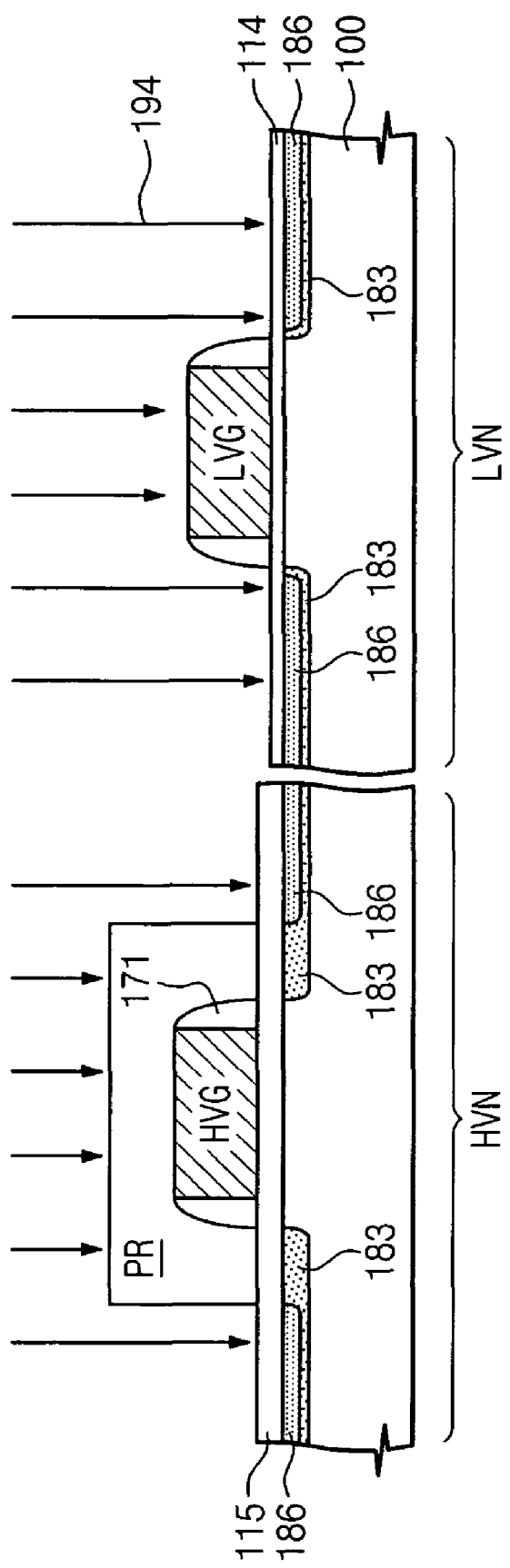
Figure 23:
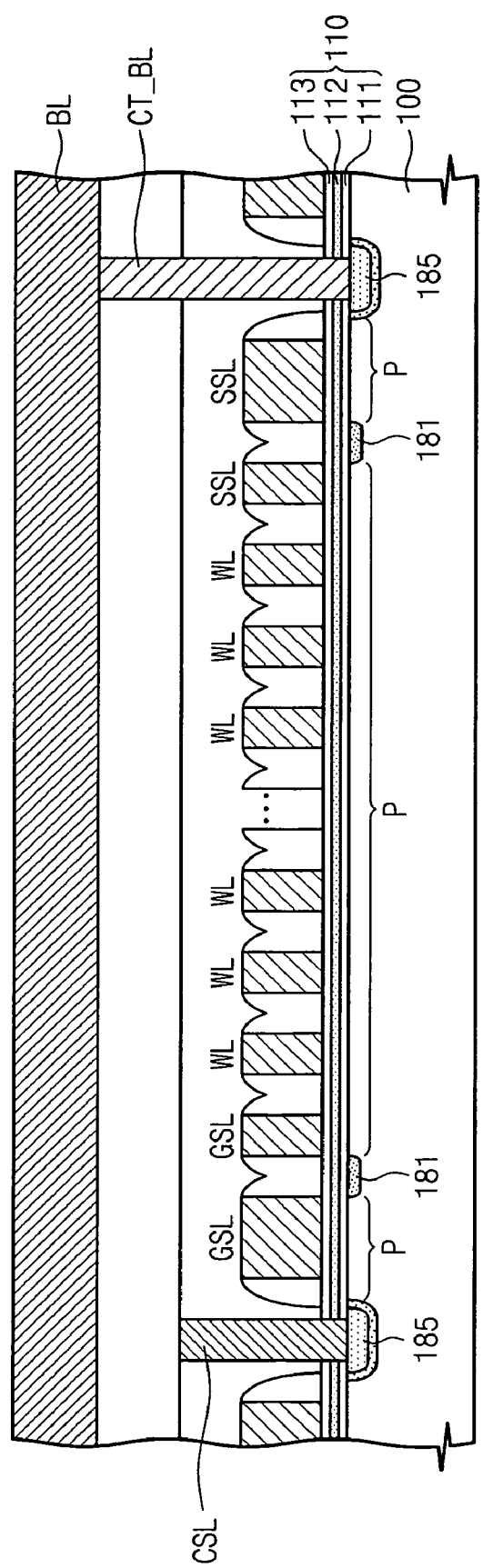
Figure 24:
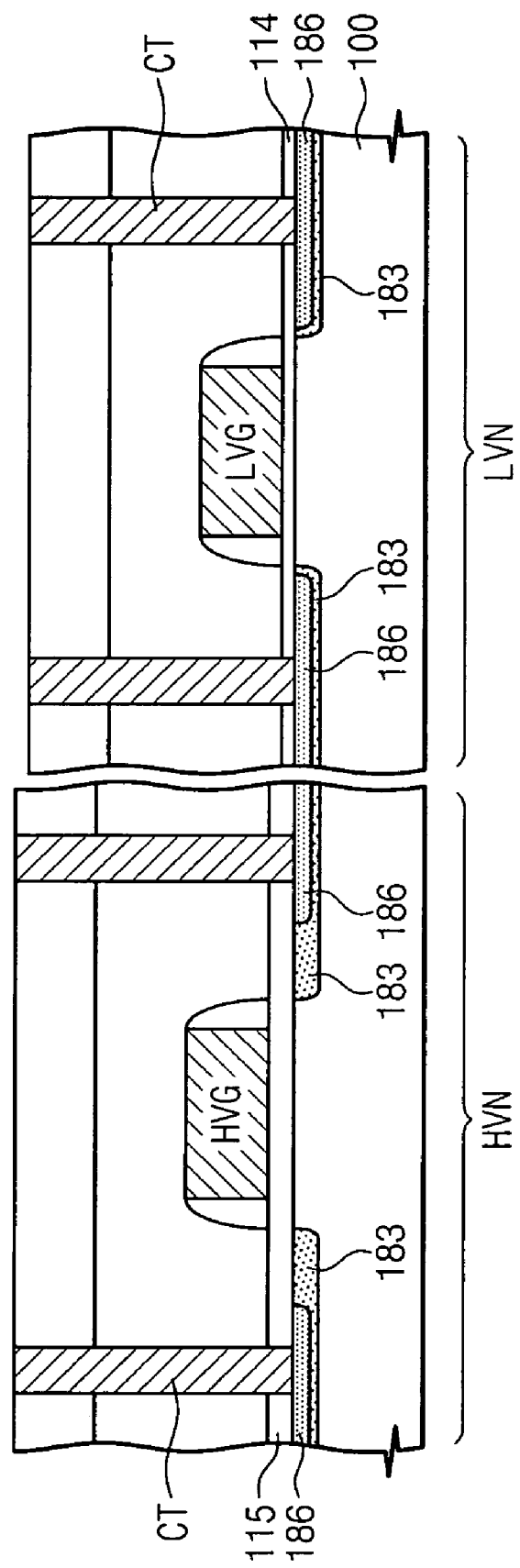

FIGS. 19 through 24 illustrate cross-sectional views of a method of fabricating a NAND flash memory device according to another example embodiment. In more detail, FIGS. 19, 21, and 23 illustrate a portion of a cell array region of a NAND flash memory, and FIGS. 20, 22, and 24 illustrate a portion of a peripheral circuit region of the NAND flash memory corresponding to FIGS. 19, 21, and 23.

Referring to FIGS. 19 and 20, the device isolation layer 102 of FIG. 13 may be formed in the semiconductor substrate 100 to define the active region, and the information storage layer 110 may be formed on the active region. Then, the gate structure, e.g., a plurality of word lines WL and selection lines GSL and SSL, crossing over the active region may be formed on the semiconductor substrate 100, as described previously with reference to FIG. 11. It is noted that the gate structures may further include dummy word and/or selection lines, as described previously with reference to FIGS. 5-10.

As illustrated in FIG. 19, spacer patterns 170 may be formed on sidewalls of word and selection lines of the gate structure. At this point, as the NAND flash memory may be highly integrated, i.e., a distance between adjacent word lines WL or between a selection line and word line WL adjacent thereto may be substantially minimized, facing spacer patterns 170 of adjacent word line WL may contact each other so regions between the word and selection lines may be filled with the spacer pattern 170, as further illustrated in FIG. 19. It is noted, however, that an interval 172 between two adjacent gate structures may be broader than an interval between two adjacent word lines WL in order to dispose the common source line CSL and the bit line contact plug CT_BL. Thus, as illustrated in FIGS. 19 and 20, a portion of the active region, e.g., a portion of an upper surface of the information layer 110, in the interval 172 between two gate structures may be exposed by the spacer patterns 170.

Next, by using the gate structure and the space patterns 170 as an ion mask, an ion implantation process 193 may be performed to form source/drain region 182 of a low concentration in the active region between two adjacent gate structures, i.e., in the interval 172. As mentioned above, because the spacer pattern 170 is filled between the lines constituting the gate structure, the source/drain region 182 of the low concentration may not be formed within the gate structure, i.e., in the active region between the word and selection lines of the gate structure. In this respect, it is noted that the impurity regions 181 of a low concentration may be formed in the active region between each of the selection line GSL and SSL and a corresponding word line WL most adjacent thereto before formation of the spacer pattern 170. Because the source/drain region 182 and the low concentration impurity region 181 are formed through respectively different processes, impurity types, impurity concentrations and doping profiles may vary.

Next, a high voltage transistor and a low voltage transistor may be formed in a peripheral circuit region. In more detail, formation of the high voltage transistor may include forming a high voltage gate insulation layer 115 on the semiconductor substrate 100 and forming a high voltage gate electrode HVG on the high voltage gate insulation layer 115, as illustrated in FIG. 20. Formation of the low voltage transistor may include forming a low voltage insulation layer 114 on the semiconductor substrate 100 and forming a low voltage gate electrode LVG on the low voltage gate insulation layer 114, as further illustrated in FIG. 20.

At this point, the high voltage gate electrode HVG and the low voltage gate electrode LVG may be formed using the forming of the line WL, SSL, and GSL constituting the cell array. Consequently, the high and low voltage gate electrodes HVG and LVG may have a substantially same material and same thickness. The high voltage gate insulation layer 115 may be formed to be thicker than the low voltage gate insulation layer 114, and the high and low voltage insulation layers 115 and 114 may be formed to have a different kind of a thin layer than the information storage layer 110. For example, each of the high voltage and low voltage gate insulation layers 115 and 114 may be a single silicon oxide layer. Due to a difference between their thicknesses and layer types, the high voltage and low voltage gate insulation layers 115 and 114 may be formed through a modified process for forming the information storage layer 110 or an additional process. The high voltage and low voltage gate insulation layers 115 and 114 and the information storage layer 110 may be formed through any suitable method.

As further illustrated in FIG. 20, peripheral spacer patterns 171 may be formed on sidewalls of the high voltage gate electrode HVG and the low voltage gate electrode LVG. Additionally, peripheral low concentration impurity regions 183 may be formed at both sides of the high voltage and low voltage electrodes HVG and LVG. It is noted that the peripheral low concentration impurity regions 183 and the low concentration impurity region 181 of the cell array region may be formed simultaneously before formation of the spacer patterns 170 in the cell region. For example, the cell low concentration impurity regions 181 and peripheral low concentration impurity regions 183 may be formed through an ion implantation process 195, e.g., using the peripheral spacer pattern 171 as an ion mask, after forming the peripheral spacer pattern 171.

It is noted that formation of the peripheral low concentration impurity region 183 after forming the peripheral spacer pattern 171 may be different from a conventional manufacturing method of, e.g., a MOS transistor. Due to this difference, the peripheral low concentration impurity region 183 may be spaced apart from the high voltage or low voltage gate electrode HVG or LVG via the peripheral spacer pattern 171, as illustrated in FIG. 20. Consequently, the active region between the peripheral low concentration impurity region 183 and the high voltage or low voltage gate electrode HVG or LVG may form the above-mentioned field effect source/drain. That is, in contrast to a conventional MOS transistor, the active region below the spacer pattern in example embodiments may be used as a channel region that is inversed by a voltage applied to the high or low voltage gate electrode HVG or LVG.

Next, as illustrated in FIGS. 21 and 22, a cell high concentration source/drain impurity region 185 and a peripheral high concentration impurity region 186 may be formed on the low concentration source/drain region 182 and on the peripheral low concentration impurity region 183, respectively. It is noted that each of the high concentration source/drain impurity region 185 and peripheral high concentration impurity region 186 may have a higher impurity concentration than either of the low concentration source/drain region 182 and peripheral low concentration impurity region 183. Formation of the high concentration source/drain impurity region 185 and peripheral high concentration impurity region 186 may be done through, e.g., an ion implantation process 194 using the gate structure of the cell array region and gate electrodes HVG and LVG of the peripheral circuit region as ion masks. Accordingly, the high concentration source/drain impurity region 185 and the peripheral high concentration impurity region 186 may be formed in a region that is substantially identical to the low concentration source/drain region 182 and the peripheral low concentration impurity region 183. For example, as illustrated in FIG. 21, a portion of the low concentration source/drain region 182 may surround the high concentration source/drain impurity region 185.

As further illustrated in FIG. 22, when a high voltage transistor is formed by using a mask pattern PR that covers the high voltage gate electrode HVG, the peripheral high concentration impurity region 186 may be spaced apart from the peripheral spacer pattern 171. The mask pattern PR may be, e.g., a photoresist pattern formed through a photolithography process. When the peripheral high concentration impurity region 186 is spaced apart from the high voltage gate electrode HVG, e.g., spaced apart from the spacer pattern as illustrated in FIG. 22, a breakdown voltage of the high voltage transistor may be improved.

Next, as illustrated in FIGS. 23 and 24, a wiring structure may be formed on the high concentration source/drain impurity region 185 and the peripheral high concentration impurity region 186. The wiring structure may include the common source line CSL and bit line contact plug CT_BL contacting the high concentration source/drain impurity region 185 and a contact plug CT contacting the peripheral high concentration impurity region 186 of the peripheral circuit region. It is noted that the NAND flash memory of FIG. 23 may include, e.g., additional selection lines.

Figure 25:
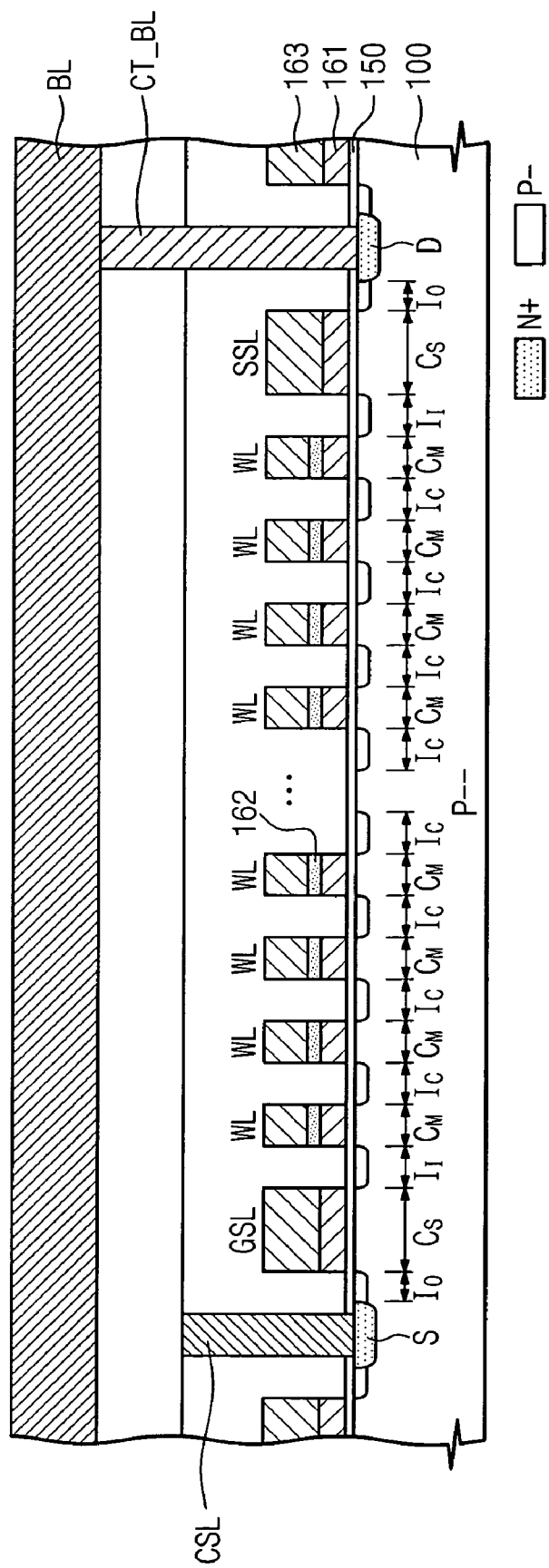
FIGS. 25-26 illustrate cross-sectional views of a NAND flash memory device according to another example embodiment.
Figure 26:
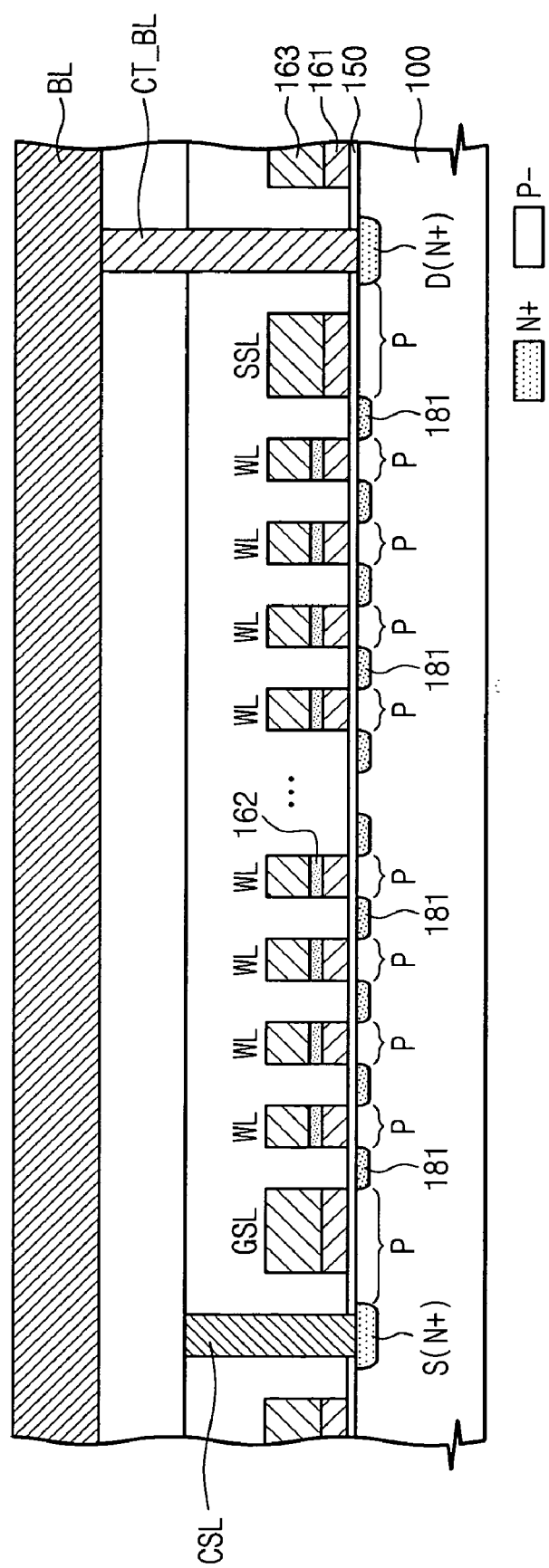

FIGS. 25 and 26 illustrate cross-sectional views of a NAND flash memory device according to another embodiment. The NAND of FIGS. 25-26 may be substantially the same as the NAND of FIGS. 3 and 14, respectively, with the exception of having a different structure of an information layer, i.e., a floating gate flash memory, and having no spacers on sidewalls of word lines WL and selection lines GSL and SSL.

Referring to FIGS. 25 and 26, an information storage layer may include a floating gate electrode. That is, the information storage layer may include a gate insulation layer 150, a floating gate electrode 161, and a gate interlayer insulation layer 162, which may be disposed on the semiconductor substrate 100. A control gate electrode 163 may be formed on the gate interlayer insulation layer 162 to define the word lines WL. The selection lines GSL and SSL may include the control gate electrode 163, which may be electrically connected to the floating gate electrode 161.

As further illustrated in FIGS. 25 and 26, source and drain regions S and D may be formed in the active region to have a substantially same structure as described previously with reference to FIGS. 4 and 15. It is noted that a floating gate flash memory may have source/drain regions formed in the active region according to any of the embodiments discussed previously with reference to FIGS. 3-10 and 14-18.

Figure 27:
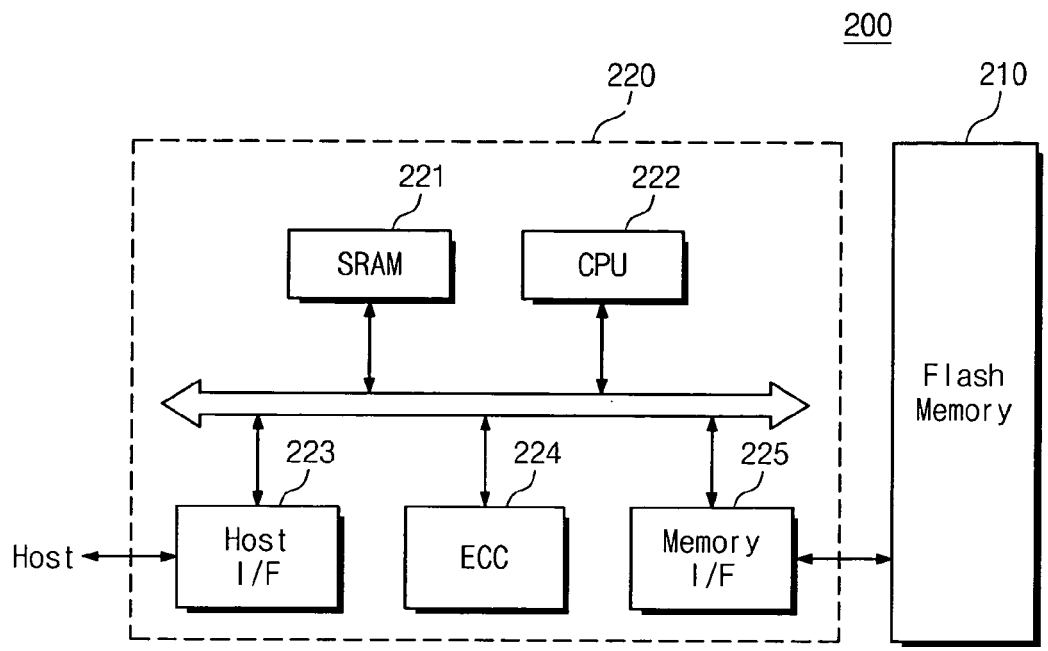
FIG. 27 illustrates a block diagram of a memory card with a flash memory device according to an example embodiment.

FIG. 27 illustrates a block diagram of a memory card 200 with a flash memory device according to an example embodiment. Referring to FIG. 27, in order to support a high capacity data storage, the memory card 200 may be equipped with a flash memory 210. The memory card 200 may include a memory controller 220 for controlling general data exchange between a host and the flash memory 210.

SRAM 221 may be used as an operating memory of a central processing unit (CPU) 222. A host interface (I/F) 223 may have a data exchange protocol of the host connected to the memory card 200. An error checking and correcting (ECC) block 224 may detect and correct an error in data read from the flash memory 210. A memory I/F 225 may interface with the flash memory 210. The CPU 222 may perform a general control operation for data exchange of the memory controller 220. Although not illustrated in the drawings, the memory card 200 may further include ROM (not shown) to store code data used for interfacing with the host.

According to a flash memory device and a memory card or a memory system of an example embodiment, because selection transistors constituting a cell array of the flash memory 210 may have a field effect source/drain structure in order to substantially increase an effective channel length, reliability of the memory card 200 or an information processing system 300, as will be discussed in more detail below with reference to FIG. 28. The flash memory device according to example embodiments may be provided in a memory system, e.g., a solid state disk (SSD).

Figure 28:
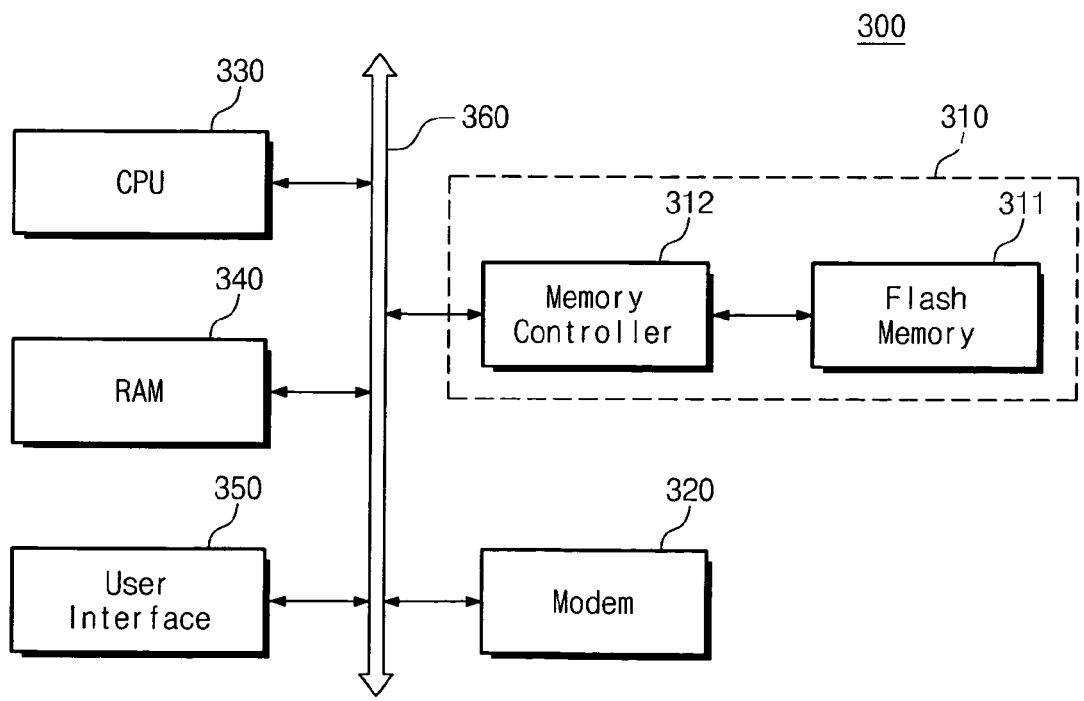
FIG. 28 illustrates a block diagram of an information processing system equipped with a flash memory system according to an example embodiment.

FIG. 28 illustrates a block diagram of the information processing system 300. The information processing system 300 may include a flash memory system 310, a modem 320, a CPU 330, a random access memory (RAM) 340, and a user interface 350. Referring to FIG. 28, the flash memory system 310 may a memory device according to example embodiments, and may be mounted in the information processing system 300, e.g., a mobile device or a desktop computer. Data processed by the CPU 330 or inputted from the external may be stored in the flash memory system 310. It is noted that the flash memory system 310 may include SSD, so the information processing system 300 may stably store a large amount of data in the flash memory system 310. As its reliability is increased, a resource consumed for error correction may be saved. Therefore, the flash memory system 310 may provide a fast data exchange function to the information processing system 300. Although not illustrated, an application chipset, a camera image processor (CIS), an input/output device, etc. may be further provided in the information processing system 300.

Additionally, a flash memory device or a memory system according to example embodiments may be mounted through various forms of packages. That is, the flash memory device or the memory system may be packaged and mounted through diverse packages. Examples of the various packages may include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline package (TSOP), thin quad flatpack (TQFP), system in package (SIP), multi chip package (MCP), wafer-level fabricated package (WFP), wafer-level processed stack package (WSP), etc.

According to example embodiments, at least one of transistors of a semiconductor device may include field-effect source/drain regions having a higher threshold voltage than a channel. Accordingly, the semiconductor device may have improved leakage current blocking characteristics, so short channel effects may be substantially suppressed. Further a NAND flash memory device may include at least one such transistor, so the NAND flash memory may have improved program characteristics. Further, source/drain regions of at least one of selection transistors of the NAND flash memory device may respectively have a field effect source/drain structure and a p-n junction source/drain structure, so the NAND flash memory device may have substantially suppressed short channel effects and cell leakage current characteristics.

Example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
    a semiconductor substrate including at least one memory channel region and at least one memory source/drain region, the memory channel region and the memory source/drain region being arranged alternately; and
    at least one word line on the memory channel region, wherein
    the memory source/drain region has a higher net impurity concentration than the memory channel region, and
    the memory source/drain region is configured to be inversed by a fringe field from a word line adjacent to the memory source/drain region.

2. The semiconductor device as claimed in claim 1, wherein the memory source/drain region and the memory channel region have a same conductivity type.

3. The semiconductor device as claimed in claim 1, wherein the memory source/drain region has a higher threshold voltage than the memory channel region.

4. The semiconductor device as claimed in claim 1, wherein the memory source/drain region is a source/drain electrode of a memory cell transistor.

5. The semiconductor device as claimed in claim 1, wherein the net impurity concentration of the memory channel region is higher below a sidewall of the word line than below a middle part of the word line.

6. The semiconductor device as claimed in claim 1, wherein the semiconductor device includes:
    a plurality of word lines; and
    at least one selection line adjacent to an outermost word line of the plurality of word lines, the plurality of word lines being positioned only at a first side of the selection line.

7. The semiconductor device as claimed in claim 6, further comprising an outer contact region disposed at a second side of the selection line, the selection line being between the outer contact region and the outermost word line, and the outer contact region having a different conductivity type than the memory channel region and being connected to a bit line or a common source line,
    wherein a region between the outer contact region and the selection line is configured to be inversed by a fringe field from the selection line.

8. The semiconductor device as claimed in claim 7, further comprising an impurity region between the outer contact region and the selection line, the impurity region having the same conductivity type as the memory channel region.

9. The semiconductor device as claimed in claim 6, further comprising at least one impurity region having a different conductivity type than the memory channel region, the impurity region being between the selection line and the outermost word line.

10. The semiconductor device as claimed in claim 6, wherein the plurality of word lines includes at least one dummy word line, the dummy word line being the outermost word line adjacent to the selection line and defining a dummy cell not storing data.

11. The semiconductor device as claimed in claim 6, wherein the semiconductor device includes:
    at least a first selection line and a second selection line, the plurality of word lines being between the first and second selection lines; and
    at least one dummy word line adjacent to each of the first and second selection lines.

12. The semiconductor device as claimed in claim 11, wherein the semiconductor device includes at least two impurity regions having a different conductivity type than the memory channel region, a first impurity region being between the first selection line and a dummy word line adjacent thereto, and a second impurity region being between the second selection line and a dummy word line adjacent thereto.

13. The semiconductor device as claimed in claim 6, wherein the semiconductor device includes:
    at least first and second selection line in series, the first selection lines being between the second selection lines and the plurality of word lines; and
    a selection source/drain region having a same conductivity type as the memory channel region and a higher net impurity concentration than the memory channel region, the selection source/drain region being between the first and second selection lines.

14. The semiconductor device as claimed in claim 1, further, comprising an information storage between the word line and the memory channel region, the information storage being a charge trap structure including a sequentially-stacked tunnel insulation layer, charge storage layer, and a blocking insulation layer or a floating gate structure including a sequentially-stacked gate insulation layer, floating gate electrode, and a gate interlayer insulation layer.

15. A semiconductor memory device, comprising:
an active region in a semiconductor substrate; and
a plurality of word lines crossing the active region on the semiconductor substrate, a portion of the active region between two adjacent word lines having a higher threshold voltage than a portion of the active region below each of the word lines.

16. The semiconductor memory device as claimed in claim 15, wherein the word lines define a word line structure, and the semiconductor memory device further comprises:
a selection line structure adjacent to the word line structure, the selection line structure including at least one selection line disposed around the word line structure,
at least one dummy word line adjacent to the selection line, and
an impurity region having a different conductivity type than a semiconductor substrate below the word line, the impurity region being in a semiconductor substrate portion between the selection line and the dummy word line.

17. The semiconductor memory device as claimed in claim 16, wherein a portion of the active region adjacent to the selection line has a higher threshold voltage than a portion of the active region below the word line.

18. The semiconductor memory device as claimed in claim 16, wherein the selection line structure includes a first selection line and a second selection line, the word line structure being between the first and second selection lines, and
at least one dummy word line adjacent to each of the first and second selection lines.

19. A semiconductor memory device, comprising:
an active region having first and second parts; and
at least two selection lines on the active region, the first part of the active region being between the two selection lines, and the second part of the active region being below each of the selection lines,
wherein the first and second parts of the active region have a substantially same conductivity type, the first part of the active region having a higher net impurity concentration than the second part of the active region.

20. A semiconductor device, comprising:
at least two selection transistors; and
a plurality of memory cell transistors connected in series between the two selection transistors, at least one of the selection transistors and the memory cell transistors having a same gate structure including a sequentially-stacked tunnel insulation layer, charge storage layer, and a blocking insulation layer,
wherein at least one of the memory cell transistors includes a memory channel region and a memory source/drain region, the memory channel region being formed in a semiconductor substrate below the gate structure, and the memory source/drain region having the same conductivity type as the memory channel region and being formed in a semiconductor substrate at both sides of the gate structure, and
wherein an impurity region having a different conductivity type than the memory channel region is between a gate structure of the selection transistor and a gate structure of the memory cell transistor most adjacent to the selection transistor.

* * * * *